(12) United States Patent
Sakakura et al.

(10) Patent No.: US 7,948,171 B2
(45) Date of Patent: May 24, 2011

(54) LIGHT EMITTING DEVICE

(75) Inventors: Masayuki Sakakura, Kanagawa (JP);
Takeshi Noda, Kanagawa (JP); Hideaki Kuwabara, Kanagawa (JP); Shunpei Yamazaki, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 600 days.

(21) Appl. No.: 11/352,185

(22) Filed: Feb. 10, 2006

(65) Prior Publication Data
US 2006/0186804 A1 Aug. 24, 2006

(30) Foreign Application Priority Data

Feb. 18, 2005 (JP) ................. 2005-043102

(51) Int. Cl.
*H01L 51/50* (2006.01)
*H01L 51/52* (2006.01)
(52) U.S. Cl. ...................... 313/506; 313/498
(58) Field of Classification Search ............ None
See application file for complete search history.

(56) References Cited

U.S. PATENT DOCUMENTS

| | | | |
|---|---|---|---|
| 5,786,664 A | 7/1998 | Liu | |
| 6,294,274 B1 | 9/2001 | Kawazoe et al. | |
| 6,380,687 B1 | 4/2002 | Yamazaki | |
| 6,384,427 B1 | 5/2002 | Yamazaki et al. | |
| 6,420,834 B2 | 7/2002 | Yamazaki et al. | |
| 6,433,487 B1 | 8/2002 | Yamazaki | |
| 6,445,005 B1 | 9/2002 | Yamazaki et al. | |
| 6,462,722 B1 | 10/2002 | Kimura et al. | |
| 6,515,310 B2 | 2/2003 | Yamazaki et al. | |
| 6,555,968 B2 | 4/2003 | Yamazaki et al. | |
| 6,605,826 B2 | 8/2003 | Yamazaki et al. | |
| 6,608,449 B2 | 8/2003 | Fukunaga | |
| 6,641,933 B1 | 11/2003 | Yamazaki et al. | |
| 6,692,845 B2 | 2/2004 | Maruyama et al. | |
| 6,699,739 B2 | 3/2004 | Yamazaki et al. | |

(Continued)

FOREIGN PATENT DOCUMENTS

CN 1445821 A 10/2003

(Continued)

OTHER PUBLICATIONS

Shizuo Tokito, Koji Noda and Yasunori Taga; Metal oxides as a hole-injecting layer for an organic electroluminescent device; J. Phys. D: Appl. Phys. 29 (1996) 2750-2753.; (http://iopscience.iop.org/0022-3727/29/11/004).*

(Continued)

*Primary Examiner* — Toan Ton
*Assistant Examiner* — Britt D Hanley
(74) *Attorney, Agent, or Firm* — Husch Blackwell LLP

(57) ABSTRACT

A manufacturing method of an active matrix light emitting device in which the active matrix light emitting device can be manufactured in a shorter time with high yield at low cost compared with conventional ones will be provided. It is a feature of the present invention that a layered structure is employed for a metal electrode which is formed in contact with or is electrically connected to a semiconductor layer of each TFT arranged in a pixel area of an active matrix light emitting device. Further, the metal electrode is partially etched and used as a first electrode of a light emitting element. A buffer layer, a layer containing an organic compound, and a second electrode layer are stacked over the first electrode.

42 Claims, 11 Drawing Sheets

U.S. PATENT DOCUMENTS

| | | |
|---|---|---|
| 6,737,306 B2 | 5/2004 | Yamazaki et al. |
| 6,739,931 B2 | 5/2004 | Yamazaki et al. |
| 6,750,618 B2 | 6/2004 | Yamazaki et al. |
| 6,798,132 B2 | 9/2004 | Satake |
| 6,852,998 B2 | 2/2005 | Sung et al. |
| 6,858,878 B2 | 2/2005 | Yamazaki et al. |
| 6,861,710 B2 | 3/2005 | Murakami et al. |
| 6,894,312 B2 | 5/2005 | Yamazaki et al. |
| 6,956,324 B2 | 10/2005 | Yamazaki |
| 6,958,490 B2 | 10/2005 | Okamoto et al. |
| 6,995,511 B2 | 2/2006 | Yamazaki et al. |
| 7,009,204 B2 | 3/2006 | Tsai et al. |
| 7,033,848 B2 | 4/2006 | Murakami et al. |
| 7,049,190 B2 | 5/2006 | Takeda et al. |
| 7,061,014 B2 | 6/2006 | Hosono et al. |
| 7,098,602 B2 | 8/2006 | Yamazaki et al. |
| 7,105,868 B2 | 9/2006 | Nause et al. |
| 7,112,374 B2 | 9/2006 | Yamazaki et al. |
| 7,297,977 B2 | 11/2007 | Hoffman et al. |
| 7,323,356 B2 | 1/2008 | Hosono et al. |
| 7,402,506 B2 | 7/2008 | Levy et al. |
| 7,402,948 B2 | 7/2008 | Yamazaki et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,468,304 B2 | 12/2008 | Kaji et al. |
| 7,482,182 B2 | 1/2009 | Yamazkai et al. |
| 7,492,012 B2 | 2/2009 | Murakami et al. |
| 2001/0020922 A1 | 9/2001 | Yamazaki et al. |
| 2001/0026125 A1 | 10/2001 | Yamazaki et al. |
| 2001/0046003 A1 | 11/2001 | Song |
| 2001/0054867 A1 | 12/2001 | Kubota |
| 2002/0047120 A1 | 4/2002 | Inukai |
| 2002/0063287 A1 | 5/2002 | Yamazaki et al. |
| 2003/0162314 A1 | 8/2003 | Yamazaki et al. ............... 438/46 |
| 2003/0194484 A1 | 10/2003 | Yamazaki et al. ............... 427/66 |
| 2003/0197466 A1 | 10/2003 | Yamazaki et al. ............ 313/504 |
| 2003/0201447 A1 | 10/2003 | Yamazaki et al. |
| 2003/0227021 A1 | 12/2003 | Yamazaki et al. ............... 257/83 |
| 2004/0012747 A1 | 1/2004 | Yamazaki et al. |
| 2004/0031442 A1 | 2/2004 | Yamazaki et al. ............ 118/727 |
| 2004/0035360 A1 | 2/2004 | Yamazaki et al. ............ 118/715 |
| 2004/0139914 A1 | 7/2004 | Yamazaki et al. ............ 118/719 |
| 2004/0171182 A1 | 9/2004 | Yamazaki et al. |
| 2004/0195964 A1 | 10/2004 | Yamazaki et al. |
| 2004/0235275 A1 | 11/2004 | Yamazaki et al. |
| 2005/0001541 A1 | 1/2005 | Yamazaki et al. |
| 2005/0005848 A1 | 1/2005 | Yamazaki et al. ............ 118/719 |
| 2005/0012445 A1 | 1/2005 | Yamazaki et al. |
| 2005/0073243 A1 | 4/2005 | Yamazaki et al. ............ 313/498 |
| 2005/0162092 A1 | 7/2005 | Yamazaki et al. |
| 2005/0199959 A1 | 9/2005 | Chiang et al. |
| 2006/0014465 A1 | 1/2006 | Yamazaki |
| 2006/0082300 A1 | 4/2006 | Yamazaki et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0208977 A1 | 9/2006 | Kimura |
| 2006/0231882 A1 | 10/2006 | Kim et al. |
| 2006/0238135 A1 | 10/2006 | Kimura |
| 2006/0267030 A1 | 11/2006 | Yamazaki et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0007870 A1 | 1/2007 | Yamazaki et al. |
| 2007/0024187 A1 | 2/2007 | Shin et al. |
| 2007/0046191 A1 | 3/2007 | Saito |
| 2007/0052025 A1 | 3/2007 | Yabuta |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0158652 A1 | 7/2007 | Lee et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2009/0114910 A1 | 5/2009 | Chang |

FOREIGN PATENT DOCUMENTS

| | | |
|---|---|---|
| CN | 1453883 A | 11/2003 |
| JP | 60-170972 | 9/1985 |
| JP | 11-307264 | 11/1999 |
| JP | 11307264 | * 11/1999 |
| JP | 2004-006327 | 1/2004 |
| JP | 2004-031201 | 1/2004 |
| JP | 2004-063461 | 2/2004 |
| KR | 2003-0057408 | 7/2003 |

OTHER PUBLICATIONS

Office Action re Chinese application No. CN 200810185584.9, dated Jan. 22, 1010 (with English translation).

Nomura, K. et al, "Room-Temperature Fabrication of Transparent Flexible Thin-Film Transistors Using Amorphous Oxide Semiconductors," Nature, vol. 432, Nov. 25, 2004, pp. 488-492.

Masuda, S. et al, "Transparent Thin Film Transistors Using ZnO as an Active Channel Layer and Their Electrical Properties," Journal of Applied Physics, vol. 93, No. 3, Feb. 1, 2003, pp. 1624-1630.

Nomura, K. et al, "Thin-Film Transistor Fabricated in Single-Crystalline Transparent Oxide Semiconductor," Science, vol. 300, May 23, 2003, pp. 1269-1272.

Office Action re Korean application No. KR 2008-0125925, dated Aug. 30, 2010 (with English translation).

* cited by examiner contour of 37
contour of 36c
light emitting region

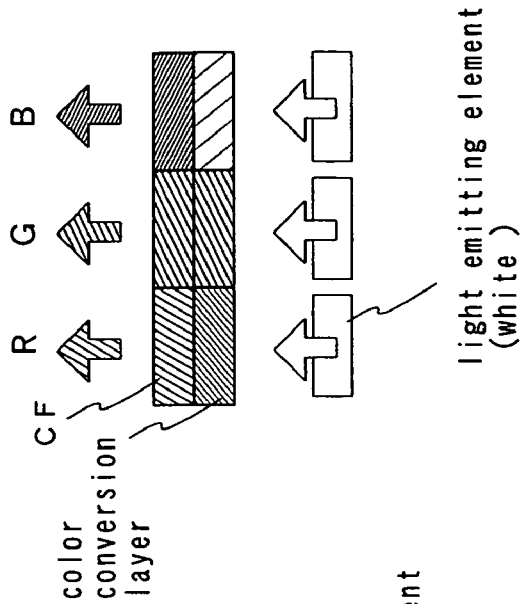
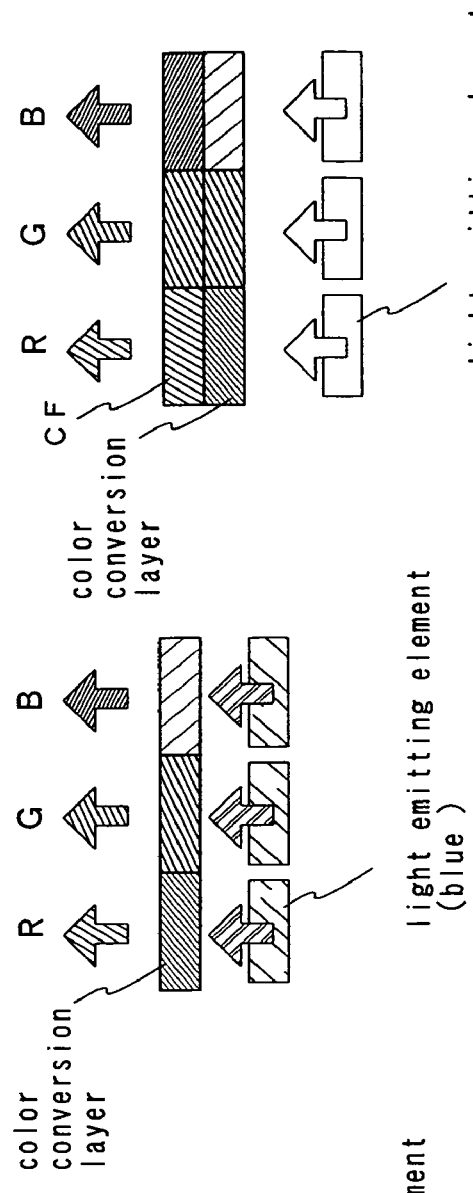
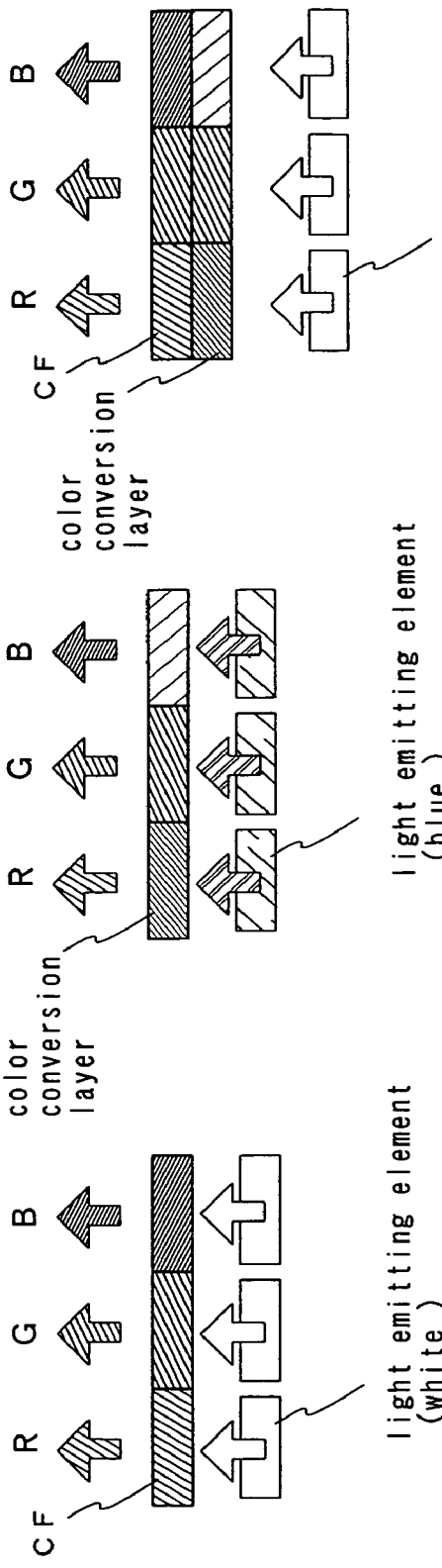

LIGHT EMITTING DEVICE

BACKGROUND OF THE INVENTION

1. Field of the Invention

The present invention relates to a light emitting device with a light emitting element that emits fluorescent light or phosphorescent light upon application of electric field to a pair of electrodes of the element which sandwich a layer containing an organic compound (hereinafter, an organic compound layer), and to a method of manufacturing the light emitting device. Further, the present invention relates to a deposition apparatus for forming an organic compound layer or the like.

2. Description of the Related Art

Light emitting elements, which use organic compounds as a light emitting member and are characterized by the thinness, lightweight, fast response, and direct current low voltage driving, are expected to be applied to next-generation flat panel displays. Among display devices, ones having light emitting elements arranged in matrix are considered to be particularly superior to conventional liquid crystal display devices for their wide viewing angle and excellent visibility.

It is said that light emitting elements emit light through the following mechanism: voltage is applied between a pair of electrodes that sandwich an organic compound layer, electrons injected from the cathode and holes injected from the anode are recombined at the luminescent center of the organic compound layer to form molecular excitons, and energy is released while the molecular excitons return to the base state to cause the light emitting element to emit light. Singlet excitation and triplet excitation are known as excitation states, and it is considered that luminescence can be conducted through either one of those excitation states.

Such light emitting devices having light emitting elements arranged in matrix can use passive matrix drive (simple matrix type), active matrix drive (active matrix type), or other driving methods. However, if the pixel density is increased, active matrix drive in which each pixel (or each dot) has a switch is considered advantageous because they can be driven at low voltage.

Organic compounds for forming a layer containing an organic compound (strictly, light emitting layer), which is the center of a light emitting element, are classified into low molecular weight materials and high molecular weight (polymer) materials. Both types of materials are being studied but high molecular weight materials are attracting more attention because they are easier to handle and have higher heat resistance than low molecular weight materials.

A conventional active matrix light emitting device includes a light emitting element in which an electrode electrically connected with a TFT over a substrate is formed as an anode, an organic compound layer is formed thereover, and a cathode is formed thereover. Light generated at the organic compound layer can be extracted at the TFT side through the anode that is a transparent electrode.

In view of the above, the applicants suggested an active matrix light emitting device including a light emitting element having a structure in which an electrode on a TFT side, which is electrically connected to a TFT over a substrate is formed as an anode, a layer containing an organic compound is formed over the anode, and a cathode that is a transparent electrode is formed over the layer containing an organic compound (a top emitting structure) (Reference 1: Japanese Patent Laid-Open No. 2004-6327, Reference 2: Japanese Patent Laid-Open No. 2004-63461, and Reference 3: Japanese Patent Laid-Open No. 2004-31201).

The present invention provides a structure and a manufacturing method of an active matrix light emitting device in which the active matrix light emitting device can be manufactured in a shorter time with high yield at low cost compared with conventional ones.

It is a feature of the present invention that a layered structure is employed for a metal electrode which is formed in contact with or is electrically connected to a semiconductor layer of each TFT arranged in a pixel area of an active matrix light emitting device. Further, the metal electrode is partially etched and used as a first electrode of a light emitting element. A buffer layer, a layer containing an organic compound, and a second electrode layer are stacked over the first electrode.

The metal electrode to be formed in contact with the semiconductor layer of the TFT is processed and used as a first electrode; thus, the steps of forming a first electrode can be omitted.

Further, in the invention, a first electrode obtained by partially etching a metal electrode may be one or two layers of a metal film in a region which is in contact with a buffer layer (namely, a light emitting region). In addition, three or four layers of the metal film may be formed in a region in which a contact hole which reaches a semiconductor layer of a TFT is provided. The first electrode of the invention is not limited to the structure in which the region having three or four layers of the metal film surrounds the light emitting region.

The first electrode of the invention has different number of layers depending on the parts, so that steps are formed at the boundaries between layers having different number of layers. The steps are covered with an insulator (referred to as a bank, a partition wall, mound, or the like). Incidentally, at least an upper end of the insulator is curved to have curvature radius; the curvature radius preferably 0.2 μm to 0.3 μm. The curvature radius is provided to obtain good step coverage; thus, a layer containing an organic compound or the like to be formed later can be formed with extremely thin thickness.

Further, by providing a buffer layer on the metal electrode, distance between the first electrode and a second electrode in the light emitting element can be increased; accordingly, a short circuit in the light emitting element due to irregularities on the surface of the metal electrode or the like can be prevented.

The buffer layer is a composite layer of an organic compound and an inorganic compound which can accept electrons from the organic compound. Specifically, the buffer layer is a composite layer containing a metal oxide and an organic compound.

Further, the buffer layer is preferable because of superior conductivity in addition to the effect which is considered to be obtained by adding an inorganic compound (greater heat resistance or the like).

Accordingly, the thickness of the buffer layer can be made thicker without increase in the drive voltage; thus, a short circuit in an element due to dust in forming the light emitting element or the like can be prevented, and the yield can be improved.

In a full color light emitting device having three kinds (R, G, and B) of light emitting elements, the light emission efficiency varies depending on the emission colors. Excess current has been necessarily supplied in a light emitting element having bad light emission efficiency in order to balance the luminance of the whole light emitting surface of the light emitting device, which has been imperfection causing acceleration of deterioration of the light emitting device.

In accordance with the present invention, by controlling the thickness of the buffer layer, the distance between the first electrode and each light emitting layer is controlled by controlling the layer provided therebetween thereby improving the light emission efficiency. An excellent image can be displayed with clear color light emitted from each light emitting element; thus, a light emitting device with low power consumption can be realized.

Such advantages obtained by providing a buffer layer can not be obtained using a conventional hole transporting layer in which an organic compound and an inorganic compound which do not electrically affect each other are simply mixed.

Further, the buffer layer has both characteristics of hole injecting (or hole transporting) characteristics and electron injection (electron transporting) characteristics. Accordingly, a buffer layer may also be provided between the layer containing an organic compound and the second electrode so that the first electrode, a first buffer layer, the layer containing an organic compound, a second buffer layer, the second electrode may be stacked in order.

A light emitting device according to the invention includes a light emitting element having a first electrode connected to a semiconductor layer of a thin film transistor over a substrate having an insulating surface; an insulator covering an end portion of the first electrode; a buffer layer over the first electrode; a layer containing an organic compound over the buffer layer; and a second electrode over the layer. The first electrode has a first region and a second region having different number of layers from the first region, a step is formed at a boundary between the first region and the second region, and the step is covered with the insulator.

A light emitting device according to the invention includes a light emitting element having a first electrode electrically connected to a semiconductor layer of a thin film transistor over a substrate having an insulating surface; an insulator covering an end portion of the first electrode; a buffer layer over the first electrode; a layer containing an organic compound over the buffer layer; and a second electrode over the layer. The first electrode has a first region and a second region having different number of layers from the first region, a step is formed at a boundary between the first region and the second region, and the step is covered with the insulator.

In any of the above structures of a light emitting device above, a light emitting device includes a pixel area provided with the plurality of light emitting elements and a driver circuit having a plurality of thin film transistors, and the driver circuit includes a wiring having a same stack as the second region.

Further in the structure of a light emitting device above, the buffer layer is provided in contact with the first region of the first electrode. The buffer layer contains a composite material of an organic compound and an inorganic compound, and the inorganic compound is one or more selected from the group consisting of titanium oxide, zirconium oxide, hafnium oxide, vanadium oxide, niobium oxide, tantalum oxide, chromium oxide, molybdenum oxide, tungsten oxide, manganese oxide, and rhenium oxide. The buffer layer contains a composite material containing an organic compound having hole transporting characteristics and an inorganic compound.

In the above structure, the first electrode includes a first region having a metal film indulging two layers and a second region having a metal film including four layers. Alternatively, the first electrode includes a first region having a metal film indulging two layers and a second region having a metal film including three layers. Still alternatively, the first electrode includes a first region having a single layer metal film and a second region having a metal film including two or more layers. The number of the steps can be reduced as the number of the layers in a stack is reduced, and the total manufacturing time can be reduced In each of the above structure, the first electrode has a film mainly containing an element selected from the group consisting of Ti, TiN, $TiSi_xN_y$, Al, Ag, Ni, W, $WSi_x$, $WN_x$, $WSi_xN_y$, Ta, $TaN_x$, $TaSi_xN_y$, NbN, MoN, Cr, Pt, Zn, Sn, In, and Mo; or an alloy or a compound mainly containing the above element; or a stack of the films.

For example, when the first electrode has a first region including a single layer of Ti and a second region having a metal film of a stack including two layers (a Ti layer and Al layer), the number of the steps for forming a film can be reduced. In the case where the first electrode is in contact with the drain region, the Ti film is preferable since it has low contact resistance with a semiconductor (silicon). Further, when an Al film is used for the metal film stacked in the second region, the first electrode can be a low resistance electrode.

Further, in the case of using a structure in which a first region of a W single layer and a second region of a metal film having a stack including two layers (a W layer and an Al layer), etching can be easily conducted since the W film and the Al film has different etching rate.

Further, in each of the above structures, the area of a light emitting area of a light emitting element is smaller than the area of the first region.

Further, in each of the above structure, the second electrode is a light-transmitting conductive film.

Further, a structure of the invention for realizing the above structure includes a method for manufacturing a light emitting device including a plurality of light emitting elements having a first electrode, a layer containing an organic compound over the first electrode, and a second electrode over the layer containing an organic compound, comprising the steps of: forming a semiconductor layer of a thin film transistor; forming an insulating film covering the semiconductor layer of the thin film transistor; forming an electrode formed with a stack of metal layers in contact with the semiconductor layer of the thin film transistor, over the insulating film; removing a part of the stack of the electrode to form a first region, a second region having more layers than the first region, and a step at a boundary between the first region and the second region; forming an insulator covering the step and the second region of the first electrode; forming a buffer layer in contact with the first region; forming the layer containing an organic compound over the buffer layer; and forming the second electrode which transmits light over the layer containing an organic compound.

The structure of the invention is not limited to a full color display device having a pixel area provided with three kinds of light emitting elements (R, G, and B). For example, a full color display device can be obtained by combining a light emitting element of white light emission and a color filter. Alternatively, a full color display device can be obtained by combining a light emitting element of single color light emission and a color conversion layer. A full color display device may be manufactured using a pixel area provided with light emitting elements of four or more colors, for example (R, G, B, and W).

The present invention further suggests a new deposition apparatus in which an evaporation source is moved while a substrate is moved. FIGS. 7A and 7B each show an example of a deposition apparatus of the invention.

FIG. 7A shows a deposition apparatus includes a film formation chamber provided with an deposition shield for keeping the sublimation direction of a deposition material and a plurality of openings. The deposition material is sublimated through the plurality of openings. An evaporation source which is movable in a direction perpendicular to the moving direction of a substrate (also referred to as a transfer direction) is provided under the deposition shield. Further, the width Wb of the deposition shield is longer than the substrate width Wa so that the thickness of a deposited film is uniformed.

A deposition apparatus according to the invention includes a means for moving a substrate in a first direction in a film formation chamber; a deposition shield which can control heating temperature, which is fixed to an internal wall of the film formation chamber; and an evaporation source under the deposition shield and a means for moving the evaporation source in a second direction perpendicular to the first direction under the deposition shield. The deposition shield has a rectangular shape having a wider width than the width Wa of the substrate, a plurality of openings are provided on a top surface of the deposition shield, and a deposition material evaporated from the evaporation source is deposited to the substrate through the plurality of openings provided on the deposition shield.

A setting chamber connected to the film formation chamber may be provided via a gate in order to supply the deposition material to a crucible of the evaporation source. FIG. 7A shows an example of providing two crucibles provided on the evaporation source. However, the number of crucibles is not limited in particular and three or more crucibles may be provided, or one crucible may be provided. Further, the plurality of crucibles provided on the evaporation source may be inclined so that the evaporation centers converges thereby conducting co-evaporation.

The present invention further relates to a method for manufacturing a light emitting device using the above deposition apparatus including a plurality of light emitting elements each provided with a first electrode, a layer containing an organic compound over the first electrode, and a second electrode over the layer containing an organic compound. The substrate is moved and the evaporation source is moved in a direction perpendicular to the moving direction of the substrate in a film formation chamber to form a layer containing an organic compound over the first substrate.

The deposition apparatus shown in FIG. 7A can be set as one part of a multi-chamber manufacturing apparatus. In the case where the deposition apparatus shown in FIG. 7A is connected to an in-line manufacturing apparatus, it is connected to a transfer chamber in which pressure can be reduced. In the case of using one deposition shield and one evaporation source for one film formation chamber, the substrate is preferably moved over the openings of the deposition shield plural times to obtain desired film thickness.

As shown in FIG. 7B, two deposition shields may be provided perpendicularly to the moving direction of the substrate, and an evaporation source is provided on each deposition shield thereby continuously deposit the same deposition material to form a film. Film formation speed can be improved with the use of such a deposition apparatus. Further, nonuniformity of the film thickness of the deposited deposition material can be reduced by moving the evaporation source. The two deposition shields are provided parallel to each other with enough distance therebetween. Further, as to the deposition apparatus shown in FIG. 7B, a desired film thickness can be obtained without reciprocating the substrate above the deposition shields. Accordingly, the substrate can be moved in one direction and the deposition apparatus is preferably applied to an in-line manufacturing apparatus in which a plurality of chambers are arranged and connected in series. The deposition apparatus shown in FIG. 7B can also transfer the substrate; in the case of connecting the deposition apparatus shown in FIG. 7B to an in-line manufacturing apparatus, the chamber is connected between two chambers in which pressure can be reduced.

Alternatively, different deposition materials may be set on two evaporation sources to continuously form stacked layers. For example, a first organic compound and an inorganic compound are separately set on two crucibles of a first evaporation source; a substrate is moved above the first evaporation source so that a buffer layer is deposited on the substrate. Subsequently, the substrate is moved over a second evaporation source in which a second organic compound is set on its crucible so that a light emitting layer can be deposited on the buffer layer.

Further, the present invention relates to another method for manufacturing a light emitting device using the above deposition apparatus, in which the light emitting device includes a plurality of light emitting elements each provided with a first electrode, a layer containing an organic compound on the first electrode, and a second electrode on the layer containing an organic compound over a substrate having an insulating surface. The method for manufacturing a light emitting device includes the steps of forming a semiconductor layer of a thin film transistor; forming an insulating film covering the semiconductor layer of the thin film transistor; forming an electrode formed with a stack of metal layers in contact with the semiconductor layer of the thin film transistor, over the insulating film; removing a part of the stack of the electrode to form a first region, a second region having more layers than the first region, and a step at a boundary between the first region and the second region; forming an insulator covering the step and the second region of the first electrode; forming a buffer layer in contact with the first region by moving the substrate in a film formation chamber while moving the first evaporation source in a direction perpendicular to the moving direction of the substrate; forming the layer containing an organic compound over the buffer layer by moving the substrate by moving the substrate in the film formation chamber while moving the second evaporation source in a direction perpendicular to the moving direction of the substrate; and forming the second electrode which transmits light over the layer containing an organic compound.

Through the above manufacturing steps, the number of the manufacturing steps can be reduced by continuously forming a buffer layer and a layer containing an organic compound in one film formation chamber.

Note that a light emitting device in this specification means an image display device, a light emitting device and a light source (including an illumination device). In addition, the light emitting device includes all of a module in which a light emitting device is connected to a connector such as an FPC (Flexible Printed Circuit), a TAB (Tape Automated Bonding) tape or a TCP (Tape Carrier Package), a module in which a printed wiring board is provided on the tip of a TAB tape or a TCP, and a module in which an IC (Integrated Circuit) is directly mounted on a light emitting element using COG technology.

An electroluminescent element includes an anode, a cathode, and a layer containing an organic compound creating luminescence (electroluminescence) by applying an electric field (hereinafter referred to as an EL layer). Luminescence in an organic compound includes luminescence that is obtained when a singlet-excited state returns to a ground state (fluorescence) and luminescence that is obtained when a triplet-excited state returns to a ground state (phosphorescence). A light emitting device manufactured using a manufacturing apparatus and a film formation method according to the invention can be applied to whichever of the cases using either luminescence.

A light emitting element including an EL layer (an electroluminescent element) has a structure in which the EL layer is interposed between a pair of electrodes. Typically, the EL layer has a layered structure in which a hole transport layer, a light emitting layer, and an electron transport layer are stacked in order. The structure provides extremely high light emission efficiency, and is employed for most of light emitting devices that are currently under research and development.

Further, the structure in which an anode, a hole injection layer, a hole transport layer, a light emitting layer, and an electron transport layer are stacked in order; or the structure in which an anode, a hole injection layer, a hole transport layer, a light emitting layer, an electron transport layer, and an electron injection layer are stacked in order can be used. The light emitting layer may be doped with a fluorescent pigment. All these layers can be formed of low molecular weight materials only or of high molecular weight materials only. The term "EL layer" in this specification is a generic term used to refer to all layers interposed between the anode and the cathode.

In a light emitting device according to the present invention, the drive method for screen display is not particularly limited. For example, a dot-sequential driving method, a line sequential driving method, a plane-sequential driving method or the like can be employed. Typically, a line sequential driving method is employed and a time ratio grayscale driving method or an area ratio grayscale driving method is used suitably. A video signal inputted to a source line of the light emitting device may be an analog signal or a digital signal, and driver circuits and other circuits are designed in accordance with the type of the video signal as appropriate.

In accordance with the present invention, in the case of a full-color light emitting device having three or more kinds of light emitting elements, excellent images can be displayed with clear color light emitted from each light emitting element; thus, a light emitting device with low power consumption can be realized.

BRIEF DESCRIPTION OF DRAWINGS

FIGS. 5A to 5C are schematic views each showing a method of combining a white light emitting element and a color filter (Embodiment Mode 3);

DETAILED DESCRIPTION OF THE INVENTION

Figure 1:
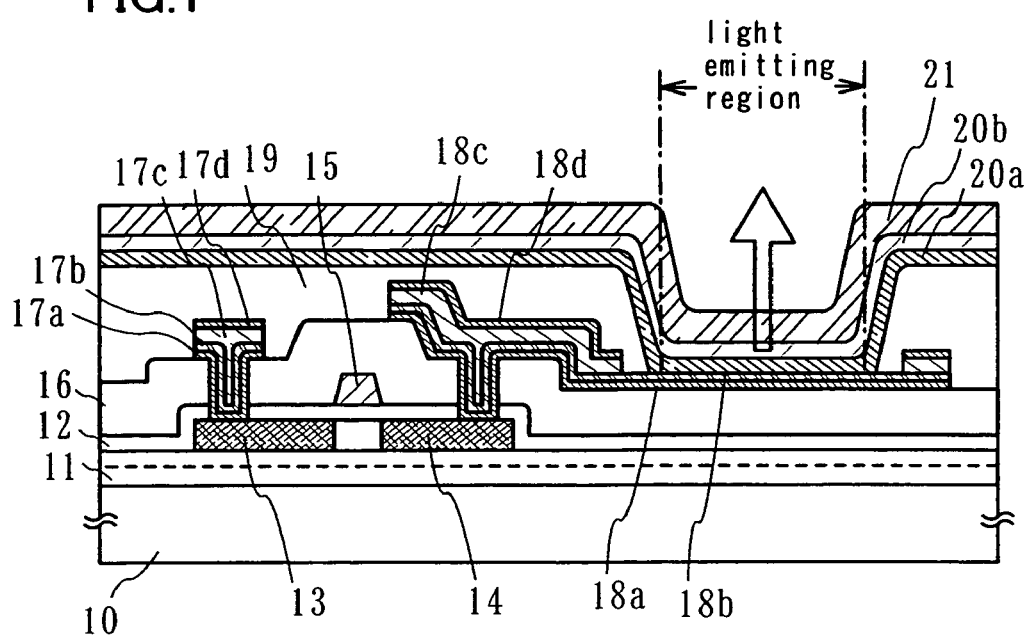
FIG. 1 is a cross-sectional view of an active matrix light emitting device (a part of a pixel) (Embodiment Mode 1)

Embodiment modes of the present invention will be described below with reference to the drawings. It is easily understood by those skilled in the art that the present invention can be carried out with various changes and modifications without departing from the content and the scope of the invention. Accordingly, the invention is to be interpreted without limitation to the descriptions in Embodiment Modes. Note that, in the drawings hereinafter referred to, the same reference numerals denote the same parts or parts having the same functions in different drawings, and the explanations will not be repeated.

Embodiment Mode 1

FIG. 1 is a cross-sectional view of an active matrix light emitting apparatus (a part of one pixel).

In FIG. 1, a TFT (p-channel TFT) provided over a substrate 10 having an insulating surface controls current flowing to a second EL layer 20b which emits light of blue, red, or green. Reference numerals 13 and 14 denote a source region or a drain region. A glass substrate, a plastic substrate, or the like can be used as the substrate 10. Alternatively, a semiconductor substrate or a metal substrate which has an insulating film on the surface can be used. A base insulating film 11 is formed over the substrate 10 (here, a bottom layer is a nitride insulating film and a top layer is an oxide insulating film). A gate insulating film 12 is provided between a gate electrode 15 and a semiconductor layer. Reference numeral 16 denotes an interlayer insulating film formed of with a single layer or a stack of an inorganic material, such as silicon oxide, silicon nitride, silicon nitride oxide, aluminum nitride, and/or aluminum nitride oxide. Although not shown, at least one or more TFTs (n-channel TFT or p-channel TFT) is/are additionally provided in one pixel. A TFT described here has one channel forming region; the number of the channel forming region is not limited thereto and a plurality of channels may be provided.

Reference numerals 18a to 18d are equivalent to a first electrode which partially functions as an anode (or a cathode) of a light emitting element. The first electrode has a structure in which a first region having two layers, a second region having four layers, and a step is caused at the boundary of the first region and the second region.

Here, reference numeral 18a is a titanium film, 18b is a titanium nitride film, 18c is a film mainly containing aluminum, and 18d is a titanium nitride film. The films are stacked in order and the titanium nitride film (a layer of the first electrode, denoted by 18b) which is in contact with a buffer layer 20a is used as an anode. A titanium nitride is preferably used because good contact resistance with the buffer layer 20a can be obtained.

Further, a power supply line denoted by 17a to 17d is formed to have similar layered structure (four layers in total). The layered structure (four layers in total) includes a film mainly containing aluminum. Thus, a low resistance wiring can be formed, and a source wiring or the like can be formed at the same time.

For example, in the case where the first electrode 18a is a 60 nm thick Ti film, the first electrode 18b is a 100 nm thick TiN film, the first electrode 18c is a 350 nm thick Al—Ti film, and the first electrode 18d is a 100 nm thick Ti film, a resist mask is formed to conduct etching. $BCl_3$ at 60 sccm and $Cl_2$ at 20 sccm are used as reactive gases, an RF (13.56 MHz) power of 450 W is applied to a coil shaped electrode at a pressure of 1.9 Pa, an RF (13.56 MHz) power of 100 W is applied to a substrate side (a sample stage), thereby conducting etching by using ICP etching apparatus. The region where Al—Ti (the first electrode 18c) is etched is etched over for 15 seconds to expose TiN (the first electrode 18b).

After forming the first electrode having a step due to the etching, an insulator 19 covering the step is formed. The insulator 19 is placed at the boundary with an adjacent pixel to surround the periphery of the first electrode. The thickness of the insulator 19 is important for keeping distance between an evaporation mask to be in contact with the insulator 19 in a subsequent step and the first electrode. The thickness of the insulator is desirably thick. In this embodiment mode, a four-layer wiring can be provided under the insulator 19; therefore, sufficient distance can be kept between the top surface of the insulator 19 and the first electrode.

Reference numeral 21 denotes a second electrode formed with a light-transmitting conductive film which functions as a cathode (or an anode) of an organic light emitting element. As the light-transmitting conductive film, ITO (indium oxide-tin oxide alloy) film, an indium oxide-zing oxide alloy ($In_2O_3$—ZnO), ZnO (zinc oxide), indium tin oxide containing silicon oxide (ITSO), tin oxide ($SnO_2$), or the like can be used. Further, the second electrode 21 is not particularly limited as long as it is transparent to visible light. For example, a stack of a thin metal layer (typically, an alloy such as MgAg, MgIn, or AlLi, or Ag or Al) and a light-transmitting conductive film can be used.

In this specification, being transparent to visible light means having a visible light transmittance of 80% to 100%.

A stack containing an EL layer, namely, a stack containing an organic compound (a stack of a first EL layer (buffer layer) 20a and a second EL layer 20b) is provided between the first electrode and the second electrode. The buffer layer 20a is a composite layer containing a metal oxide (such as molybdenum oxide, tungsten oxide, or rhenium oxide), an organic compound (a material having hole transporting characteristics (for example, N,N'-bis(3-methylphenyl)-N,N'-diphenyl-1,1'-biphenyl-4,4'-diamine (abbreviated to TPD), 4,4'-bis[N-(1-napthyl)-N-phenyl-amino]biphenyl (abbreviated to a-NPD) or 4,4'-bis[N-[4-{N,N-bis(3-methylphenyl) amino}phenyl]-N-phenylamino]biphenyl (abbreviated to DNTPD)), or the like. The second EL layer 20b may be formed using, for example, tris(8-quinolinolato) aluminum (abbreviated as $Alq_3$), tris(4-methyl-8-quinolinolato) aluminum (abbreviated as $Almq_3$) or a-NPD. Alternatively, the second EL layer 20b may be formed to contain a dopant material such as N,N'-dimethyl quinacridone (abbreviated as DMQd), Coumarin 6 or rubrene. The stack containing an organic compound, which is provided between the first electrode and the second electrode, may be formed by vapor deposition such as resistance heating.

The thickness of the buffer layer 20a is controlled so that the distance between the first electrode and the second EL layer 20b is controlled, thereby improving the light emission efficiency. By controlling the thickness of the buffer layer, an excellent image can be displayed with clear color light emitted from each light emitting element; thus, a light emitting device with low power consumption can be realized.

Alternatively, an auxiliary wiring may be provided on the second electrode 21 so as to lower the resistance of the second electrode 21.

Although not shown, a protective film is preferably formed over the second electrode 21 in order to improve the reliability of the light emitting device. This protective film is an insulating film which mainly contains silicon nitride or silicon nitride oxide, which is formed by sputtering (a DC method or an RF method), or a thin film which mainly contains carbon.

Further, a top gate TFT is described as an example here; however, the invention is applicable, regardless of the TFT structure, for example, to a bottom gate (inverted staggered) TFT or a staggered TFT. Further, the structure of the TFT is not limited to a single gate structure, and the TFT may have a multi-gate structure including a plurality of channel forming regions, for example, a double-gate structure.

In this specification, a semiconductor film mainly containing silicon, a semiconductor film mainly containing an organic material, or a semiconductor film mainly containing a metal oxide can be used as a semiconductor layer serving as an active layer of a TFT. As a semiconductor film mainly containing silicon, an amorphous semiconductor film, a semiconductor film having a crystalline structure, a compound semiconductor film having an amorphous structure, or the like can be used. Specifically, an amorphous silicon, microcrystalline silicon, polycrystalline silicon, or the like can be used. As a semiconductor film mainly containing an organic material, a semiconductor film mainly containing a substance which includes a certain amount of carbon or an allotrope of carbon (excluding diamond), which is combined with another element, can be used. Specifically, pentacene, tetracene, a thiophen oligomer derivative, a phenylene derivative, a phthalocyanine compound, a polyacetylene derivative, a polythiophene derivative, a cyanine dye, or the like can be used. Further, as the semiconductor film mainly containing a metal oxide, zinc oxide (ZnO); an oxide of zinc, gallium, and indium (In—Ga—Zn—O); or the like can be used.

Figure 2A:
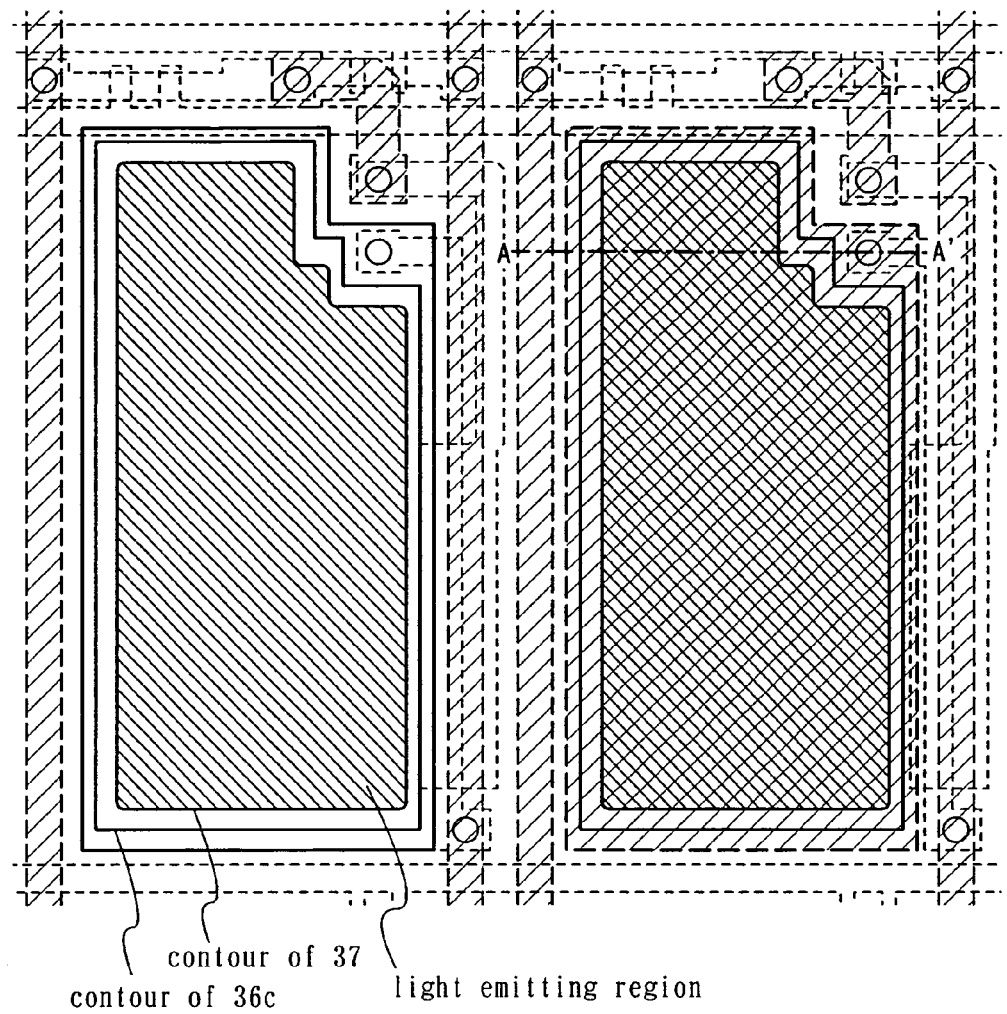
FIGS. 2A and 2B are respectively a top view and a cross-sectional view each showing an example of a pixel structure of a light emitting device (Embodiment Mode 1)
Figure 2B:
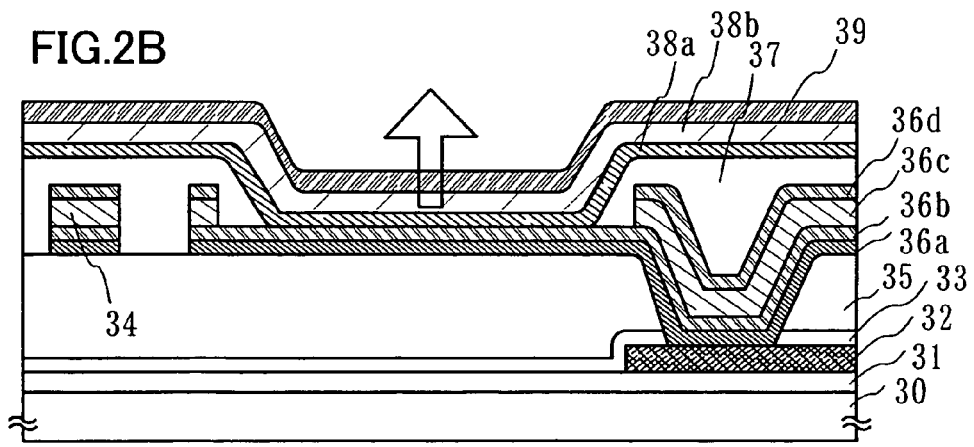

An example of the pixel structure of a light emitting device is shown in FIG. 2A. FIG. 2B shows a cross-sectional view taken along chain line A-A' in FIG. 2A. An example of steps for manufacturing a light emitting device will be described with reference to the drawings.

First, a base insulating film 31 is formed over a substrate 30 which has an insulating surface.

A silicon oxynitride film is formed as the first layer of the base insulating film 31 to a thickness of 10 nm to 200 nm (preferably, 50 nm to 100 nm) by plasma CVD using a reactive gas of $SiH_4$, $NH_3$, and $N_2O$. Here, a silicon oxynitride film (composition ratio: Si=32%, O=27%, N=24%, H=17%) is formed to a thickness of 50 nm. A silicon oxynitride film is formed thereover as the second layer of the base insulating film to a thickness of 50 nm to 200 nm (preferably, 100 nm to 150 nm) by plasma CVD using a reactive gas of $SiH_4$ and $N_2O$. Here, a silicon oxynitride film (composition ratio: Si=32%, O=59%, N=7%, H=2%) is formed to a thickness of 100 nm. The base insulating film 31 in this embodiment mode has two layers. Alternatively, the base insulating film 31 may have a single layer or a stack including three or more layers.

A semiconductor layer is formed over the base insulating film. The semiconductor layer to be an active layer of a TFT is formed as follows: an amorphous semiconductor film is formed by a known means (sputtering, LPCVD, plasma CVD, or the like); the film is crystallized by a known crystallization method (a laser crystallization method, a thermal crystallization method, or a thermal crystallization method using a catalyst such as nickel); and the crystalline semiconductor film is patterned into a desired shape. The thickness of the semiconductor layer is 25 nm to 80 nm (preferably, 30 nm to 60 nm). The material of the crystalline semiconductor film is not particularly limited; however, silicon or a silicon-germanium alloy is preferably used.

In the case of forming a crystalline semiconductor film by a laser crystallization method, an excimer laser, a YAG laser, or an $YVO_4$ laser which emits a pulsed or continuous-wave light can be used. In the case of using such a laser, the semiconductor film is preferably irradiated with laser light from a laser oscillator, which is condensed in a linear shape by an optical system. The conditions of crystallization are appropriately selected by the practitioner of the invention. In the case of using an excimer laser, the pulse repetition rate is 30 Hz and the laser energy density is 100 mJ/cm$^2$ to 400 mJ/cm$^2$ (typically, 200 mJ/cm$^2$ to 300 mJ/cm$^2$). Meanwhile, in the case of using a YAG laser, the second harmonic is preferably used; the pulse repetition rate is 1 kHz to 10 kHz, and laser energy density is 300 mJ/cm$^2$ to 600 mJ/cm$^2$ (typically, 350 mJ/cm$^2$ to 500 mJ/cm$^2$). The laser light condensed into a linear shape with a width of from 100 μm to 1000 μm, for example, 400 μm, is emitted throughout the substrate surface. The overlap ratio of the linear laser light at that time is preferably 80% to 98%.

A fundamental wave may be used without having laser light pass through a non-linear optical element, and laser annealing is conducted by irradiating an amorphous semiconductor film with pulsed laser light having high intensity and high repetition rate, thereby forming a crystalline semiconductor film. High intensity means a high peak output power per unit of time and area, and the peak output power of the laser light ranges from 1 GW/cm$^2$ to 1 TW/cm$^2$. A fundamental wave with a wavelength of about 1 μm is hardly absorbed so much by a semiconductor thin film in irradiating the semiconductor thin film with the fundamental wave. Thus, the fundamental wave has a low absorption efficiency. However, a fundamental wave emitted from a pulsed laser having a pulse width in the range of picoseconds, or in the range of femtoseconds ($10^{-15}$ seconds) can provide high intensity laser light. Thus, a non-linear optical effect (multiphoton absorption) is caused and the fundamental wave is absorbed by the semiconductor film. Since a non-linear optical element is not used and thus light is not converted to a harmonic, a laser oscillator having a higher output power than 15 W, for example, 40 W, can be used for laser annealing. Therefore, the width of a region having large grain crystals that is formed by scanning once can be increased, and thus the productivity can be improved significantly.

Subsequently, the surface of the semiconductor layer is cleaned with an etchant containing hydrogen fluoride, and a gate insulating film 33 covering the semiconductor layer is formed. The gate insulating film 33 is formed by depositing an insulating film containing silicon to have a thickness of 40 to 150 nm by plasma CVD or sputtering. In this embodiment mode, a silicon oxide nitride film is deposited (composition ratio: Si=32%, O=59%, N=7% and H=2%) to a thickness of 115 nm by plasma CVD. Naturally, the gate insulating film is not limited to a silicon oxide nitride film but may be formed with another insulating film containing silicon, which has a single layer or a layered structure.

After cleaning the surface of the gate insulating film 33, a gate electrode is formed.

Then, an impurity element imparting p-type conductivity (such as B), appropriate amount of boron here, is added to the semiconductor to form a source/drain region 32. After the addition of the impurity element, heat treatment, irradiation with intense light, or irradiation with laser light is carried out in order to activate the impurity element. Concurrently with the activation, plasma damage to the gate insulating film or to the boundary face between the gate insulating film and the semiconductor layer can be repaired. It is extremely effective to irradiate the main or the back surface with the second harmonic of a YAG laser to activate the impurity element particularly in the atmosphere of room temperature to 300° C. A YAG laser is a preferable activating means because it requires a few maintenances.

The subsequent processes are carried out as follows: an interlayer insulating film 35 is formed of an organic or inorganic material (including a deposited silicon oxide film, PSG (glass doped with phosphorus), BPSG (glass doped with boron and phosphorus), or the like), the semiconductor layer is hydrogenated, and contact holes reaching the source/drain regions are formed. Then, a source electrode (wiring 34) and a first electrode (drain electrode) 36a to 36d are formed, and the TFT (p-channel TFT) is completed.

Although a p-channel TFT is described this embodiment mode, an n-type impurity element (such as P or As) can be used instead of a p-type impurity element to form the n-channel TFT.

The first electrode (layers 36a to 36d) and the wiring 34 are formed with a film mainly including an element selected from Ti, TiN, TiSiXNY, Al, Ag, Ni, W, WSiX, WNX, WSiXNY, Ta, TaNX, TaSiXNY, NbN, MoN, Cr, Pt, Zn, Sn, In, or Mo; an alloy material or a compound material containing the above element, or a stack thereof with a total thickness range of 100 nm to 800 nm.

Particularly, in the first layer 36a which is in contact with the drain region 32, is preferably formed of Ti that can make an ohmic contact with silicon to a thickness of 10 nm to 100 nm. The second layer 36b of the first electrode is preferably formed of a material having a high work function in the case where the film is thin (TiN, TaN, MoN, Pt, Cr, W, Ni, Zn, Sn) to a thickness of 10 nm to 100 nm. The second layer 36b also functions as a blocking layer for preventing the third layer 36c and the first layer 36a of the first electrode from being alloyed with each other. As the material for forming the fourth layer 36d, a material which can prevent oxidization, corrosion, and hillocks of the third layer 36c is preferably used; a metal nitride (TiN, WN, or the like) is preferable and the thickness may be in the range of 20 nm to 100 nm.

Next, a resist mask is formed, and the first electrode is processed by etching as in the structure shown in FIG. 2B. FIG. 2A shows a boundary between the first region and the second region, that is, the contour of the third layer 36c.

After the resist mask is removed, an insulator 37 covering the step of the first electrode is formed. The contour of the insulator 37 is shown in FIG. 2A.

Next, a stack of layers 38a and 38b which contains an organic compound is formed by vapor deposition. Then, a second electrode 39 is formed.

The thus obtained light emitting element emits light in the direction indicated by the arrow in FIG. 2B.

After the second electrode (conductive film 39) is formed, the light emitting element formed over the substrate 30 is sealed by attaching a sealing substrate (transparent substrate) to the substrate using a sealing material or a sheet adhesive material. Spacers formed from a resin film may be provided in order to keep the gap between the sealing substrate and the light emitting element. The space surrounded by the sealing material is filled with nitrogen or other inert gas. For the sealing material, an epoxy resin is preferably used. Desirably, the material of the sealing material transmits as little moisture and oxygen as possible. A substance having an effect of absorbing oxygen and moisture (a desiccant or the like) may be placed in the space surrounded by the sealing material.

By enclosing the light emitting element in a space as above, the light emitting element can be completely shut off from the outside and substances that accelerate degradation of the organic compound layer, such as moisture and oxygen, can be prevented from entering the light emitting element from the outside. Accordingly, a highly reliable light emitting device can be obtained.

Embodiment Mode 2

Figure 3:
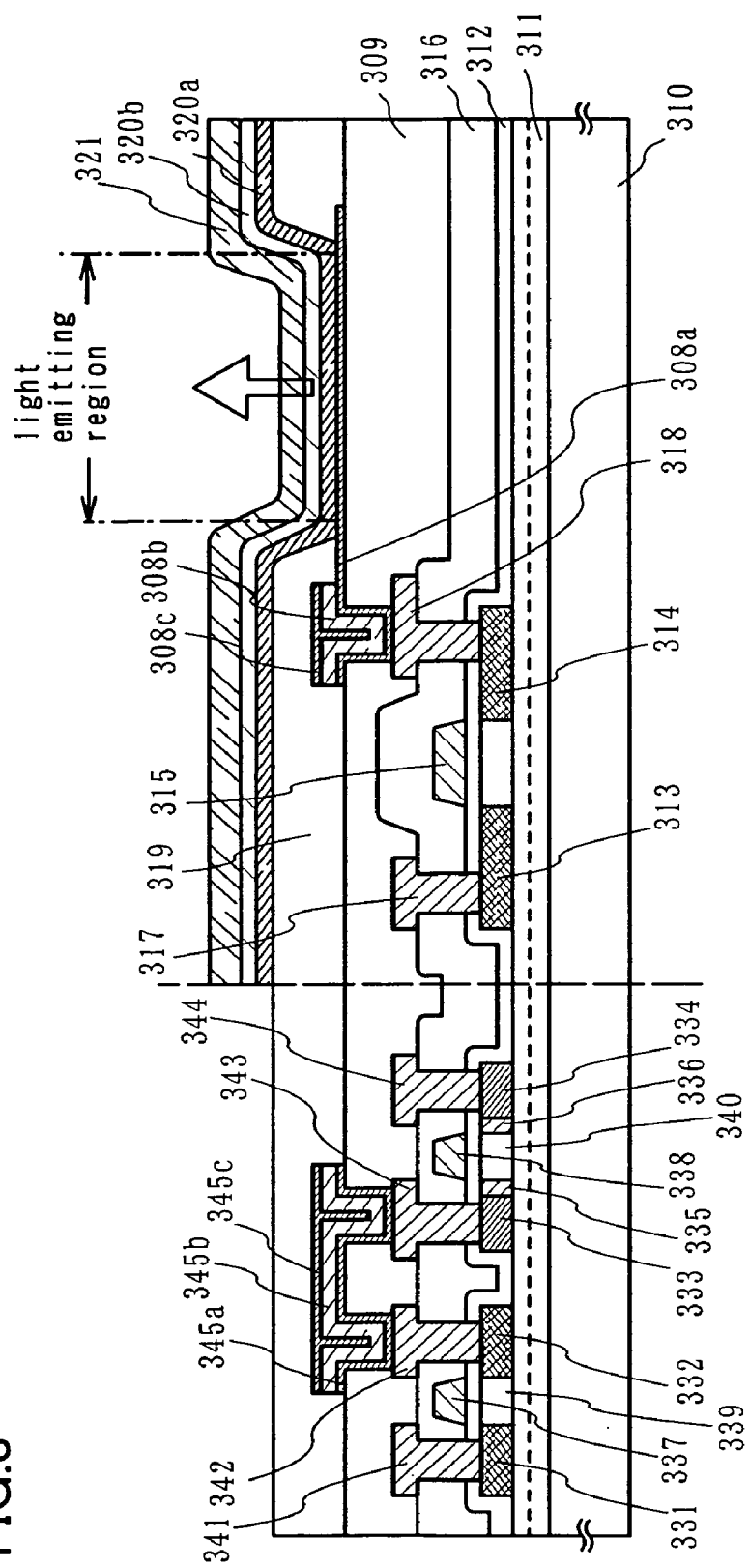
FIG. 3 is a cross-sectional view of an active matrix light emitting device (a part of a pixel) (Embodiment Mode 2)

FIG. 3 shows an example of a structure according to this embodiment mode which is different from the one in Embodiment Mode 1. FIG. 3 shows a structure in which a first electrode is not directly in contact with a semiconductor layer of a TFT, but is electrically connected to the semiconductor layer of the TFT through another electrode. The first electrode has a structure in which a first region formed with a single metal layer and a second region having three layers are provided, and a step is caused between the first region and the second region. In order to improve the aperture ratio, the first region is provided at only the periphery of the contact hole, and the second region is provided in all the other regions.

In this embodiment mode, an example of forming a pixel area and a driver circuit over one substrate will be described.

First, as in Embodiment Mode 1, a base insulating film 311, a semiconductor layer formed with a crystalline semiconductor film, and a gate insulating film 312 are formed over a substrate 310 having an insulating surface.

Next, an electrode 315 to be a gate electrode of a TFT of a pixel area and electrodes 338 and 337 which are to be a gate electrode of a TFT of a driver circuit are formed. Subsequently, an impurity element (such as B) which imparts p-type conductivity to a semiconductor, boron here, is selectively added using a resist mask, to form p-type high concentration impurity regions 313, 314, 331, and 332. After removing the resist mask, another resist mask is formed to form a low concentration impurity region by selectively adding an impurity element which imparts n-type conductivity (such as P or As), phosphorous here, thereby forming an LDD region. Further, after removing the resist mask, still another resist mask is formed, and phosphorous is selectively added to the semiconductor layer to form high concentration level impurity regions 333 and 334 are formed. Note that, the low concentration impurity region to which phosphorous is added only once becomes LDD regions 335 and 336.

The order of the dopings is not limited in particular.

After removing the resist mask, heat treatment, irradiation with intense light, or irradiation with laser light is carried out in order to activate the impurity element.

Next, a first interlayer insulating film 316 formed of an organic material or an inorganic material is formed, and hydrogenation is carried out. Subsequently, contact holes which reach the high concentration impurity region is formed in a first interlayer insulating film 316 and a gate insulating film. Next, electrodes 317, 318, and 341 to 344 to be source/drain electrodes to form a plurality of kinds of TFTs (p-channel TFT and n-channel TFT).

A p-channel TFT having an electrode 315 as a gate electrode is formed in the pixel area. An n-channel TFT having an electrode 338 as a gate electrode and a p-channel TFT having an electrode 337 as a gate electrode are formed in the driver circuit area. Note that, the n-channel TFT in the driver circuit area includes a channel forming region 340, and the p-channel TFT in the driver circuit area includes a channel forming region 339.

Next, a second interlayer insulating film 309 formed of an organic material or an inorganic material is formed. Subsequently, contact holes which reach electrodes 318, 342, and 343 are formed in the second interlayer insulating film 309.

A metal film having three layers is formed over the second interlayer insulating film 309. The three layer metal film may be a stack of films each of which mainly includes an element selected from Ti, TiN, TiSiXNY, Al, Ag, Ni, W, WSiX, WNX, WSiXNY, Ta, TaNX, TaSiXNY, NbN, MoN, Cr, Pt, Zn, Sn, In, or Mo; an alloy material or a compound material containing the above element with a total thickness range of 100 nm to 800 nm.

Here, three layers of a Ti film, an Al film, and a Ti film are stacked in order.

Next, a resist mask is formed and etching is carried out to form connection electrodes 345a to 345c and a first electrode. A lead wiring having a similar layered structure can also be formed at the same time as the connection electrodes; therefore, the area occupied by the driver circuit area can be reduced.

After removing the resist mask, another resist mask is formed to selectively etch the first electrode. Thus, the first electrode has a structure in which a first region formed with only a first layer 308a, and a second region formed with three layers in total including the first layer 308a, a second layer 308b, and a third layer 308c are provided, and a step is caused between the first region and the second region.

After the resist mask is removed, an insulator 319 covering the step of the first electrode is formed.

Next, a stack having layers 320a and 320b containing an organic compound is formed by vapor deposition. The layer 320a is a buffer layer which is a composite layer containing a metal oxide (such as molybdenum oxide, tungsten oxide, or rhenium oxide), an organic compound (a material having hole transporting characteristics (for example, N,N'-bis(3-methylphenyl)-N,N'-diphenyl-1,1'-biphenyl-4,4'-diamine (abbreviated to TPD), 4,4'-bis[N-(1-napthyl)-N-phenyl-amino]biphenyl (abbreviated to α-NPD) or 4,4'-bis[N-[4-{N,N-bis(3-methylphenyl)amino}phenyl]-N-phenylamino]biphenyl (abbreviated to DNTPD)), or the like. The layer 320b is a single layer or a stack which includes a light emitting layer. The thickness of the buffer layer 320a is controlled so that the distance between the first electrode and the second light emitting layer is controlled, thereby improving the light emission efficiency.

Next, a second electrode 321 is formed. Ag, Al; an alloy such as MgAg, MgIn, AlLi; or a light-transmitting film which is formed by codeposition of aluminum and an element in group 1 or group 2 of the periodic table can be used for the second electrode 321. Here, a top emission light emitting device which emits light through the second electrode is manufactured here; thus, a thin metal layer having a thickness of about 1 nm to 20 nm is used as the second electrode. The second electrode 321 may be thin enough to transmit light.

In addition, a transparent conductive film may be stacked over the second electrode 321.

The thus obtained light emitting element (also referred to as an EL element) emits light in the direction indicated by the arrow in FIG. 3.

After the second electrode 321 is formed, the light emitting element formed over the substrate 310 is sealed by attaching a sealing substrate (transparent substrate) to the substrate using a sealing material or a sheet adhesive material. The sealing substrate is preferably attached in an atmosphere containing an inert gas (rare gas or nitrogen).

Next, an unnecessary part of the substrate is cut off. In the case of obtaining a plurality of panels from one substrate, each panel is separated off. In the case of obtaining one panel from one substrate, the cutting step can be omitted by pasting a counter substrate which is cut in advance. At this stage, an EL module is completed.

Figure 4A:
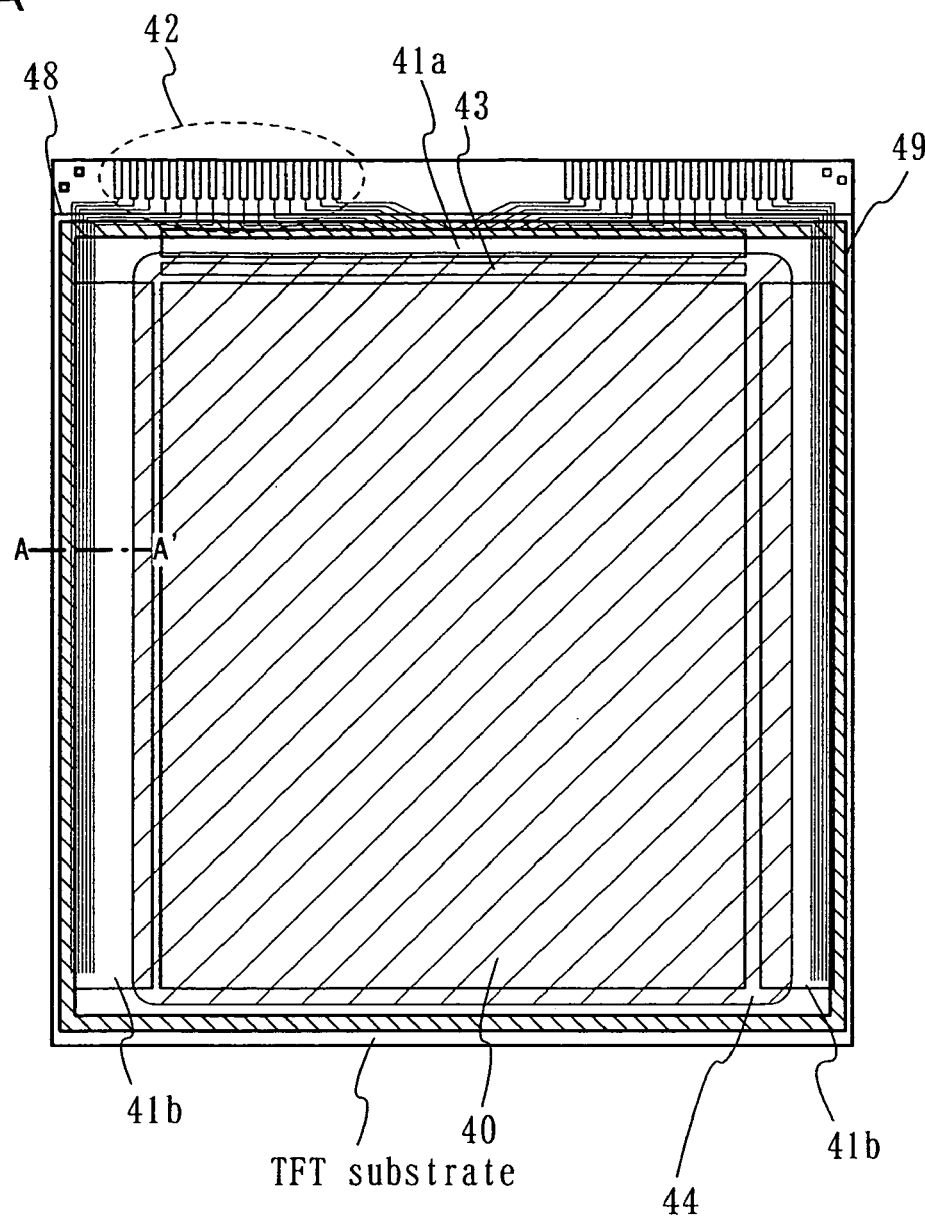
FIGS. 4A and 4B are respectively a top view and a cross-sectional view of an EL module (Embodiment Mode 2)
Figure 4B:
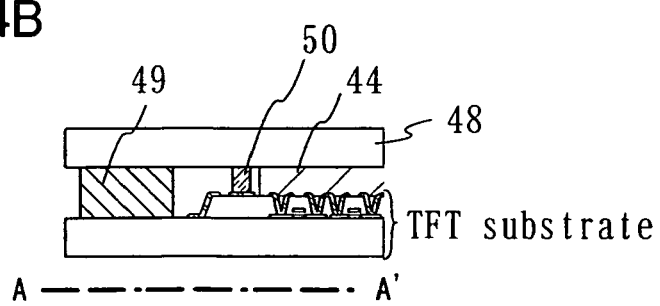

The whole EL module will be described with reference to FIGS. 4A and 4B. FIG. 4A is a top view of an EL module, and FIG. 4B is a cross-sectional view of a part thereof.

A substrate provided with many TFTs (also referred to as a TFT substrate) is further provided with a pixel area 40 where display is performed, driver circuit areas 41*a* and 41*b* for driving each pixel in the pixel area, a connection portion 43 where a second electrode formed over an EL layer is connected with a lead wiring, and a terminal area 42 to which an FPC is attached for connecting to an external circuit.

The EL element is sealed with a sealing substrate 48 for sealing an EL element, a sheet adhesive material 44, and a sealing material 49. FIG. 4B is a cross-sectional view taken along chain line A-A' in FIG. 4A.

Innumeral pixels are regularly arranged on the pixel area 40. Although not shown here, the pixels are arranged in stripe arrangement in an X direction, for example, in the order of R, G, and B. Further, the arrangement of light emitting elements is not limited; for example, delta arrangement, mosaic arrangement, or the like may be used.

As shown in FIG. 4B, a gap holding member 50 is provided so that a spacing of about 2 μm to 30 μm is kept between the pair of the substrates. Further, the sealing substrate 48 is attached with the sealing material 49; thus, all light emitting elements are sealed. Note that, if the light emitting elements can be sufficiently sealed with only the sheet adhesive material 44, the sealing material 49 is not required in particular. Further, if sufficient space can be kept between the pair of the substrates with only the sheet adhesive material 44, the gap holding member 50 is not particularly required to be provided.

A depressed portion may be formed on a part of the sealing substrate 48, which is not overlapped with the pixel area by a sandblast method. A desiccant may be provided in the depressed portion.

In this embodiment mode, a lead wiring having a similar layered structure can also be formed at the same time as the connection electrodes 345*a* to 345*c*; therefore, the area occupied by the driver circuit area can be reduced and the peripheral circuit area around the pixel area can be reduced. Further, a terminal electrode of the terminal area 42 may be formed to have a layered structure similar to the connection electrodes 345*a* to 345*c*.

Note that, this embodiment mode can be freely combined with Embodiment Mode 1.

Embodiment Mode 3

Here, several methods for manufacturing a full-color display device will be described. Specifically, a method in which three light emitting elements are used; a method in which a white light emitting element and a color filter are used in combination; a method in which a blue light emitting element and a color conversion layer are used in combination; a method in which a white light emitting element, a color conversion layer, and a color filter are used in combination; or the like may be used.

In the case of using three light emitting elements for performing full color display, pixels each of which is provided with a red light emitting element, a blue light emitting element, and a green light emitting element, which are regularly arranged are arranged in a pixel area. For example, three kinds of evaporation masks having different opening positions for each light emission colors of R, G, and B, thereby providing light emitting layers of R, G, and B by vapor deposition.

By controlling the thickness of the buffer layer for each light emitting layer, which is deposited before forming the light emitting layers, an excellent image can be displayed with clear color light emitted from each light emitting element. Thus, a light emitting device with low power consumption can be realized.

The arrangement, including a stripe pattern which is simplest, such as diagonal mosaic arrangement, triangle mosaic arrangement, RGBG four pixel arrangement, RGBW four pixel arrangement, or the like can be used for the arrangement of the light emitting elements (R, G, and B).

In addition, the color purity may be improved by using a color filter in combination.

A coloring layer for the emission color of the light emitting element may be provided to overlap the light emitting element. For example, a blue coloring layer may be provided to overlap a blue light emitting element.

A method in which a white color emitting element and a color filter are used in combination (hereinafter, referred to as a color filter method) will be explained below with reference to FIG. 5A.

The color filter method is a method in which a light emitting element having a layer containing an organic compound, which emits white light is formed and the obtained white light is made pass through a color filter to obtain light of red, green, and blue.

Although there are various methods of obtaining white color light, the case of using a light emitting layer containing a high molecular weight material which can be formed by coating will be explained here. In this case, doping with a color pigment to the high molecular weight material for forming a light emitting layer can be carried out by preparing a solution and can be much more easily achieved in comparison with a vapor deposition method for carrying out co-evaporation for doping a plurality of pigments.

Specifically, after an aqueous solution of poly(ethylenedioxythiophene)/poly(stylenesulfonic acid) (PEDOT/PSS) which functions as a hole injecting layer is applied over the entire surface of an anode containing a metal having large work function (Pt, Cr, W, Ni, Zn, Sn, In) by coating and baked, a polyvinyl carbazole (PVK) solution doped with a luminescence center pigment (1,1,4,4-tetraphenyl 1,3-butadience (TPB), 4-dicyanomethylene-2-methyl-6-(p-dimethylaminostyryl)-4H-pyran (DCM1), Nile red, coumarin 6, or the like) is applied over the entire surface by coating and baked as the light emitting layer, a cathode having a stack of a thin film including metal having small work function (Li, Mg, Cs) and a transparent conductive film (ITO (indium oxide tin oxide alloy), indium oxide zinc oxide alloy ($In_2O_3$—ZnO), zinc oxide (ZnO) or the like) stacked thereover is thereafter formed. PEDOT/PSS uses water as a solvent and is not dissolved in an organic solvent. Therefore, even when PVK is applied thereonto by coating, there is no concern of redissolving. Further, since different kinds of solvents are used for PEDOT/PSS and PVK, it is preferable that different film forming chambers are used therefor.

Further, although an example of using a stack of compound layers is shown in the above-described example, a single layer of an organic compound containing layer can be used. For example, PBD having electron transporting characteristics may be dispersed in polyvinyl carbazole (PVK) having hole transporting characteristics. Further, white color light can be obtained by dispersing 30 wt % of PBD as an electron transporting agent and dispersing pertinent amounts of four kinds of color pigments (TPB, coumarin 6, DCM1, and Nile red).

Further, the layer containing the organic compound layer is formed between the anode and the cathode; holes injected from the anode and electrons injected from the cathode are combined at the layer containing the organic compound layer; thus, white color light can be obtained in the layer containing the organic compound layer.

Alternatively, it is also possible to obtain white color light as a whole by appropriately selecting an organic compound layer which emits red color light, an organic compound layer which emits green color light, and an organic compound layer which emits blue color light, which are overlap to be mixed.

The organic compound films formed as described above can provide white color light as a whole.

Color filters respectively provided with the coloring layer (R) which absorbs light except for red color light, a coloring layer (G) which absorbing light except for green color luminescence and the coloring layer (B) which absorbs light except for blue light are formed in a direction of white color light emission from the organic compound layer; thus, white color light, white color luminescence from the light emitting elements can respectively be separated to obtain red color light, green color light, and blue color light. Further, in the case of an active matrix light emitting device, a structure in which TFTs are formed between the substrate and the color filter is used.

The arrangement, including a stripe pattern which is simplest, such as diagonal mosaic arrangement, triangle mosaic arrangement, RGBG four pixel arrangement, RGBW four pixel arrangement, or the like can be used for the arrangement of the coloring layers (R, G, and B).

A coloring layer for constituting a color filter is formed using a color resist containing an organic photosensitive material in which a pigment is dispersed. Color reproducibility as full color is sufficiently ensured by combining white luminescence and a color filter.

Further, in this case, even when different colors of light is to be obtained, since all the organic compound films emit white color light, it is not necessary to form the organic compound films to have different characteristics depending on the light emission colors. Further, a circularly polarizing plate for preventing mirror reflection is not particularly needed.

Next, a CCM (color changing mediums) method realized by combining a blue color light emitting element having a blue color luminescent organic compound film and a fluorescent color conversion layer will be explained with reference to FIG. 5B.

According to the CCM method, the fluorescent color conversion layer is excited by blue color light emitted from the blue color emitting element and the color is changed using each color conversion layer. Specifically, changing from blue color to red color using the color conversion layer (B→R), changing from blue color to green color using the color conversion layer (B→G) and changing from blue color to purer blue color using the color conversion layer (B→B) (further, changing from blue color to blue color is not necessarily carried out) are carried out to obtain red color, green color and blue color light. Also in the case of the CCM method, the structure in which TFTs are formed between the substrate and the color conversion layer is used in the case of an active matrix light emitting device.

Also in this case, it is not necessary to form the organic compound films to have different characteristics depending on the light emission colors. Further, a circularly polarizing plate for preventing mirror reflection is not particularly needed.

Further, when the CCM method is used, since the color conversion layer is fluorescent, the color conversion layer is excited by external light, which causes a problem of reduction in contrast. Therefore, as shown by FIG. 5C, the contrast may be made improved by providing color filters.

Further, this embodiment mode can be freely combined with Embodiment Modes 1 and 2.

Embodiment Mode 4

Figure 6:
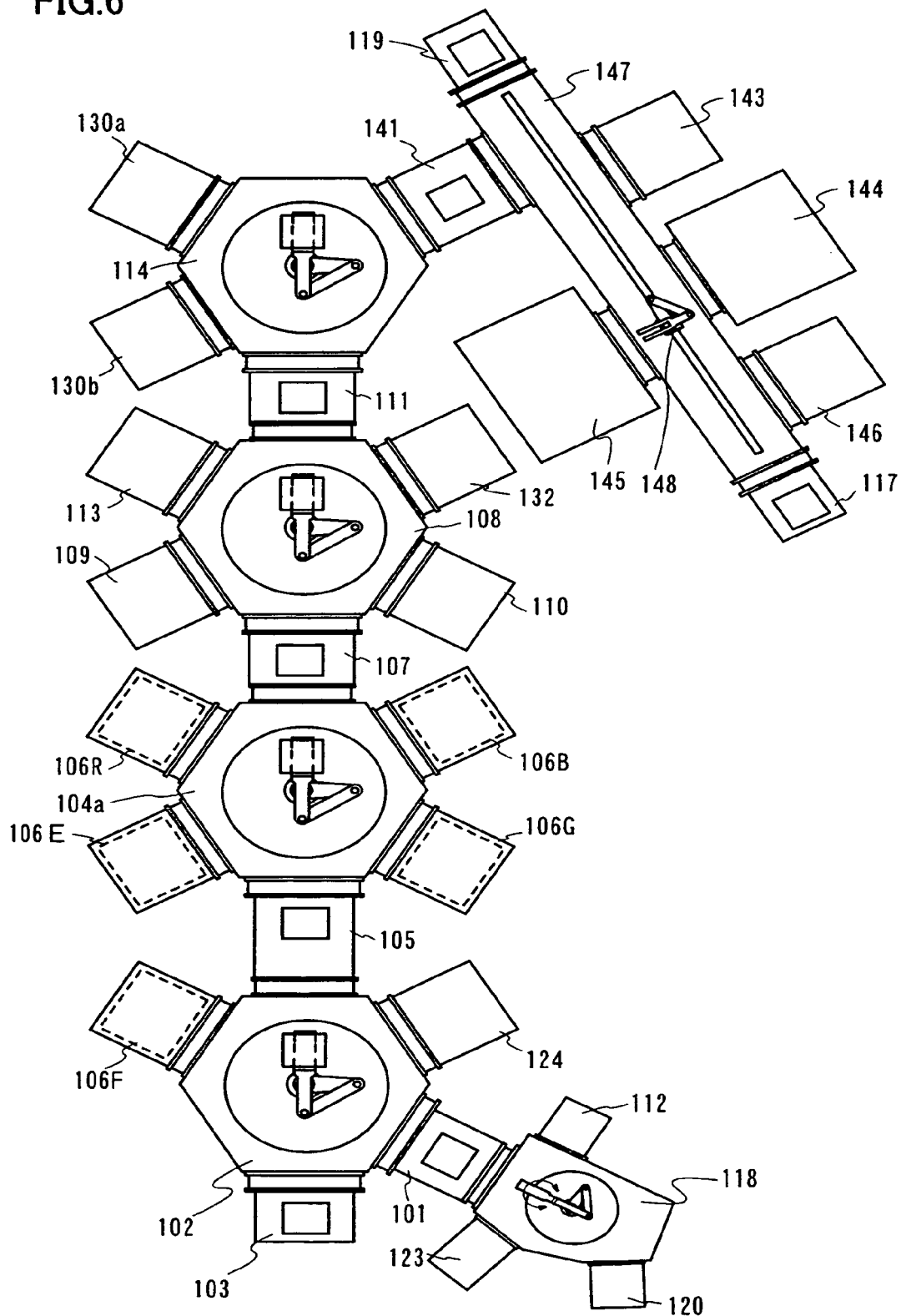
FIG. 6 is a top view of a manufacturing apparatus (Embodiment Mode 4)

FIG. 6 shows an example of a multi-chamber manufacturing apparatus, in which a multi-chamber for depositing a layer containing an organic compound or the like, and a chamber for sealing are provided as one unit. Only one unit is used, thereby preventing impurities such as moisture from mixing or improving the throughput.

The manufacturing apparatus shown in FIG. 6 includes transport chambers 102, 104a, 108, 114, and 118, delivery chambers 101, 105, 107, and 111, a first film formation chamber 106E, a second film formation chamber 106B, a third film formation chamber 106G, a fourth film formation chamber 106R, a fifth film formation chamber 106F, other film formation chambers 109, 110, 112, 113, and 132, a baking chamber 123, a mask stock chamber 124, substrate stock chambers 130a and 130b, a substrate loading chamber 120, and a multi-stage vacuum heating chamber 103. Note that, the transport chamber 104a is provided with a transporting mechanism for transporting a substrate, and the other transport chambers are each provided with the same transporting mechanism.

In addition, the manufacturing apparatus shown in FIG. 6 includes, an unloading chamber 119, a delivery chamber 141, a hardening treatment chamber 143, an attachment chamber 144, a seal formation chamber 145, a pretreatment chamber 146, and a sealing substrate loading chamber 117. Incidentally, gates are provided between the chambers.

A procedure for carrying a substrate, on which an anode (first electrode) and an insulator (partition wall) covering an end of the anode are provided in advance, into a manufacturing apparatus shown in FIG. 6 to manufacture a light emitting device will be hereinafter described.

A thin film transistor connected to the anode (TFT for current control) and a plurality of other thin film transistors (TFT for switching, or the like) are provided on a substrate in advance First, the substrate (600 mm×720 mm) is set in a substrate loading chamber 120. Such a large substrate having a size of 320 mm×400 mm, 370 mm×470 mm, 550 mm×650 mm, 600 mm×720 mm, 680 mm×880 mm, 1000 mm×1200 mm, 1100 mm×1250 mm, or 1150 mm×1300 mm can be used.

The substrate (provided with an anode and an insulator covering an end of the anode) set in the substrate loading chamber 120 is transferred to a transport chamber 118 in which the atmospheric pressure is kept. Note that a transport mechanism (transport robot or the like) for transferring and reversing the substrate is provided in the transport chamber 118.

Transport chambers 108, 114, and 102 are each provided with a transport mechanism and an evacuation means. The robot provided in the transport chamber 118 can reverse the front and the back of the substrate and can carry the substrate into a delivery chamber 101 in a reversed state. The delivery chamber 101 is connected to an evacuation treatment chamber and can be made vacuum by being evacuated and can be pressurized to the atmospheric pressure by introducing an inert gas after being the evacuation.

The evacuation treatment chamber is provided with a turbomolecular pump of a magnetically levitated type, a cryopump, or a dry pump. Thus, the transport chambers connected to respective chambers can be evacuated to $10^{-5}$ Pa to $10^{-6}$ Pa. Moreover, back diffusion of impurities from the pump side and an exhaust system can be controlled.

Subsequently, the substrate is transferred from the transport chamber 118 to the delivery chamber 101 and is further transferred from the delivery chamber 101 to the transport chamber 102 without exposure to the atmosphere.

In addition, in order to eliminate shrinkage, it is preferable to perform vacuum heating before the evaporation of a film containing an organic compound. In order to transfer the substrate from the transport chamber 102 to a multi-stage vacuum heating chamber 103 and thoroughly remove moisture and the other gases contained in the substrate, annealing for degasification is performed in vacuum ($5\times10^{-3}$ Torr (0.665 Pa) or less, preferably $10^{-4}$ Pa to $10^{-6}$ Pa). In the multi-stage vacuum heating chamber 103, a plurality of substrates is heated uniformly using a flat heater (typically, a sheath heater). A plurality of the flat heaters is set, and the substrates can be heated from both sides as the substrates are sandwiched in the flat heaters. Naturally, the substrates can be heated from one side. In particular, in the case in which an organic resin film is used as a material for the interlayer insulating film or the partition wall, since the organic resin film may absorb moisture and degasification may occur, it is effective to perform vacuum heating, in which the substrates are heated at 100° C. to 250° C., preferably, 150° C. to 200° C., for example, for thirty minutes or more and thereafter cooled naturally for thirty minutes, before forming the layer containing an organic compound to remove adsorbed moisture or the like.

If necessary, a hole injection layer containing a high molecular weight material may be formed in the film formation chamber 112 by an ink jet method, spin coating, a spraying method, or the like. After forming the hole injection layer by a coating method, it is preferable to perform heating under the atmospheric pressure or vacuum heating (at 100° C. to 200° C.) in the baking chamber 123 immediately before the film formation by a deposition method.

In addition, in the case in where a film of PEDOT/PSS is formed by spin coating, since the film is formed on the entire surface, the film on an end face or the periphery of the substrate, a terminal portion, a connection area between a cathode and a lower wiring, and the like are preferably removed in a selective manner, and it is preferable to remove the film by $O_2$ ashing or the like using a mask in a selective manner in a pretreatment chamber connected to the transport chamber 102.

In this embodiment mode, a substrate is transferred from the transport chamber 102 to the film formation chamber 106F to deposit a buffer layer on the first electrode.

An example of depositing a buffer layer will be shown. First, 4,4'-bis[N-(1-naphthyl)-N-phenylamino]biphenyl (abbreviated to NPB) and molybdenum oxide are stored in separate evaporation sources of resistance heating type, and they are deposited onto a substrate having a first electrode, which is set inside an evacuated deposition apparatus. In the vapor deposition, NPB is deposited at a deposition rate of 0.4 nm/s while molybdenum oxide is evaporated at an amount of 1/4 (weight ratio) relatively to NPB. In this case, in terms of a molar ratio, NPB:molybdenum oxide is 1:1. The first composite layer containing a metal oxide and an organic compound has a thickness of 50 nm.

Figure 7A:
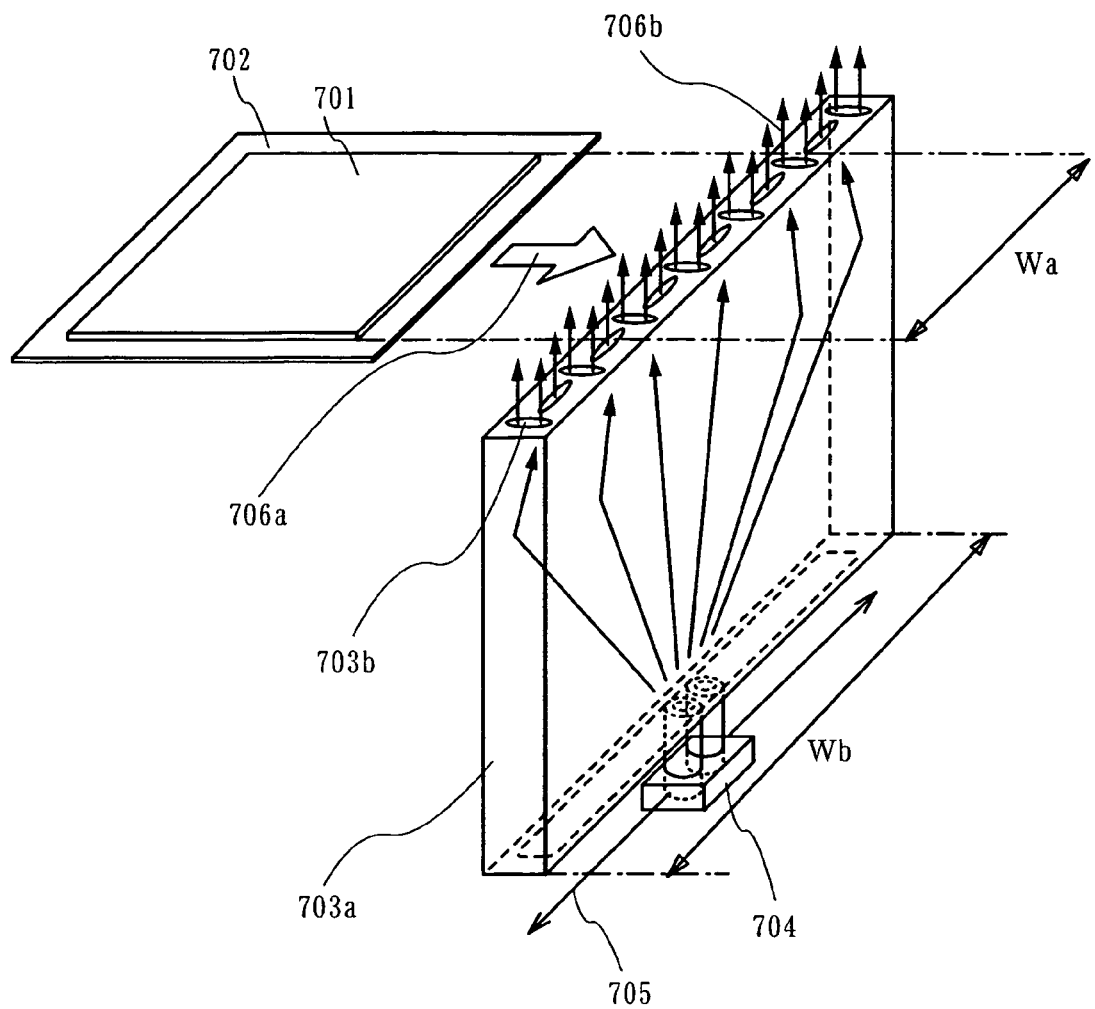
FIGS. 7A and 7B are respectively a perspective view and a top view each showing a deposition apparatus (Embodiment Mode 4)

FIG. 7A shows a perspective view of an example of a deposition apparatus of the film formation chamber 106F. The mechanism of the deposition apparatus will be briefly described below.

The substrate 701 is aligned with an evaporation mask 702 in advance. The substrate is transported in a substrate transport direction 706a (direction indicated by the arrow in FIG. 7A) in the aligned state. The substrate is transported using a substrate transport means (transport robot or transport roller) so that the substrate passes over an deposition shield 703a. The deposition shield 703a has an opening 703b so that the deposition material from an evaporation source 704 is sublimated through the opening. The deposition shield 703a is heated so that the deposition material does not adhere to the deposition shield itself thereby keeping a sublimation direction 706b of the deposition material. A heater is provided in contact with the deposition shield. A heating temperature may be controlled by a computer connected to the heater.

The evaporation source 704 has a structure on which a plurality of crucibles can be provided. The evaporation source 704 can be moved in a direction indicated by an arrow 705. An evaporation direction may be changed by changing a direction of the evaporation source 704 instead of moving the evaporation source. Resistance heating is used for the deposition method. Further, the range of the movement of the evaporation source is desirably larger than the width of the substrate Wa so that the uniformity of the thickness of the deposited film is improved. Further, the width of the adhesive shield Wb is also preferably longer than the substrate width Wa, so that the uniformity of the film thickness of the deposited film is improved.

In the case where the evaporation source is fixed when the deposition is conducted, the deposition material spreads concentrically over the substrate; thus, there is a fear that the thickness of the part which overlaps the evaporation source, that is, the thickness of the center part which spreads concentrically becomes thick. In the invention, the deposition material is prevented from spreading concentrically by the adhesive shield, and the evaporation source is moved; thus, the uniformity of the thickness is improved significantly.

Note that, in a deposition apparatus shown in FIG. 7A, the opening in the adhesive shield has an elongated elliptical shape; however, the shape and the number of the opening 703b are not limited in particular. The opening has an elongated elliptical shape so that the deposition material is prevented from stopping the opening.

Figure 7B:
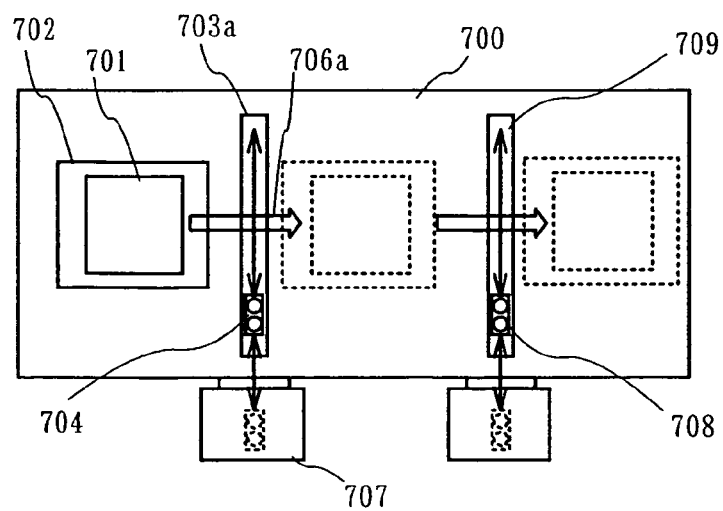

In order to supply a deposition material to a plurality of crucibles in the evaporation source, a setting chamber is provided which connects to the film formation chamber through a gate. The evaporation source provides a heater for heating the crucibles. The setting chamber is preferably provided on a line extending in the moving direction of the evaporation source in the film formation chamber. After the deposition material is supplied in the setting chamber, the setting chamber is evacuated to the same level as the film formation chamber, and heating is conducted to a stable deposition rate using a film thickness monitor provided in the setting chamber. Then, the gate is opened and the evaporation source is moved in one direction from the setting chamber to the film formation chamber. The evaporation source is also moved in the film formation chamber while keeping the direction; so that the deposition material is deposited on the substrate. The setting chamber is thus disposed so that the evaporation source can be moved smoothly. Further, a plurality of evaporation sources and adhesive shields may be provided in one film formation chamber. FIG. 7B shows a top-view of a deposition apparatus in which a plurality of evaporation sources and a setting chambers are provided. A setting chamber 707 is provided in a direction 705 of the movement of the evaporation source. The deposition material may supplied by moving the evaporation source to the setting chamber. In the case where the evaporation source is fixed in the film formation chamber, the deposition material is supplied to the evaporation source necessarily at an atmospheric pressure in the film formation chamber. Therefore, time is required for evacuating the film formation chamber for redeposition. When the setting chamber 707 is provided, atmospheric pressure and vacuum can be switched only in the setting chamber 707 while the vacuum is kept in the film formation chamber 700; thus, the deposition material can be supplied in a short time.

Further, a second adhesive shield 709 is provided in parallel to the adhesive shield 703a, and a second evaporation source 708 which moves in a direction perpendicular to the transfer direction of the substrate may be provided. A plurality of evaporation sources are provided in one film formation chamber; thus, sequential film formation into a stack can be carried out. Here, an example of providing two evaporation sources in one film formation chamber is shown; however, more than two evaporation sources may be provided in one film formation chamber.

Next, the substrate is transferred to the delivery chamber 105 from the transport chamber 102; then, the substrate can be transferred to the transport chamber 104a from the delivery chamber 105 without exposure to the atmosphere.

Next, the substrate is transferred to the film formation chambers 106R, 106G, 106B, and 106E which are connected to the transport chamber 104a as appropriate; thus, layers each containing an organic compound of low molecular weight molecules which are to be a red light emitting layer, a green light emitting layer, a blue light emitting layer, and an electron transport layer (or an electron injection layer) are formed as appropriate.

At least one of the film formation chambers 106R, 106G, 106B, and 106E is a deposition apparatus shown in FIGS. 7A and 7B.

In the film formation chamber 106B, PPD (4,4'-bis(N-(9-phenanthryl)-N-phenylamino)biphenyl) doped with CBP (4,4'-bis(N-carbazolyl)-biphenyl) is deposited, using an evaporation mask, to a thickness of 30 nm as a blue light emitting layer in a region to form a blue light emitting element.

In the film formation chamber 106R, $Alq_3$ doped with DCM is deposited, using an evaporation mask, to a thickness of 40 nm as a red light emitting layer in a region to form a red light emitting element.

In the film formation chamber 106G, $Alq_3$ doped with DMQd is deposited, using an evaporation mask, to a thickness of 40 nm as a green light emitting layer in a region to form a green light emitting element.

By suitably selecting an EL material and using a mask, a light emitting element which can emit light of three colors (specifically, R, G, and B) as a whole can be formed.

An evaporation mask is stocked in mask stock chambers 124 and transferred to film formation chambers as appropriated when vapor deposition is performed. Since the area of the mask is increased when a large substrate is used, the size of a frame for fixing the mask is increased, so that it is difficult to stock many masks. Thus, the two mask stock chambers 124 are prepared here. Cleaning of the evaporation mask may be performed in the mask stock chambers 124. In addition, since the mask stock chambers become empty at the time of vapor deposition, it is possible to stock a substrate in the mask stock chambers after film formation or after treatment.

Subsequently, the substrate is transferred from the transport chamber 104a to a delivery chamber 107 and further transferred from the delivery chamber 107 to the transport chamber 108 without exposure to the atmosphere.

Subsequently, the substrate is transferred to a film formation chamber 110 by a transport mechanism set in the transport chamber 108 to form a cathode. This cathode is preferably transparent or translucent. It is preferable to use a thin film (1 nm to 20 nm) of a metal film (alloy such as MgAg, MgIn, LiF, or, a film formed of an element belonging to the first group or second group in a periodic table and aluminum by a codeposition, or a stack of these films) formed by vapor deposition using resistance heating or a stack of the thin film (1 nm to 10 nm) of the metal film and a transparent conductive film as a cathode. In the case of using a stack, the substrate is transferred to a film formation chamber 109, and a transparent conductive film is formed by sputtering.

A light emitting element having a layered structure including the organic compound layer is formed through the above process.

In addition, the substrate may be transferred to a film formation chamber 113 connected to the transport chamber 108 and sealed by forming a protective film consisting of a silicon nitride film or a silicon nitride oxide film. Here, a target of silicon, a target of silicon oxide, or a target of silicon nitride is provided in the film formation chamber 113.

The film formation chamber 132 is a spare film formation chamber.

A substrate where at least up to a cathode is introduced into the transport chamber 114, and stored in the substrate stock chambers 130a and 130b or transferred to the delivery chamber 141 through the transport chamber 108 and the delivery chamber 111. It is preferable that the transport chamber 114, the substrate stock chambers 130a and 130b, and the delivery chamber 141 are kept under reduced pressure.

Then, the first substrate transferred to the delivery chamber 141 is transferred to an attachment chamber 144 by a transport mechanism 148 installed in the transport chamber 147.

A second substrate that serves as a sealing substrate is previously provided with columnar or wall-shaped structures. The second substrate is introduced into a substrate loading chamber 117, and heated therein under reduced pressure so that degasification is performed. The second substrate is then transferred to a pretreatment chamber 146 provided with an UV irradiation mechanism by the transport mechanism 148 which is installed in the transport chamber 147. In the pretreatment chamber 146, the surface of the second substrate is treated by UV irradiation. The second substrate is then transferred to the seal formation chamber 145 to form a sealing material thereon. The seal formation chamber 145 is provided with a dispenser device or an ink-jet device. The seal formation chamber 145 may also be provided with a baking unit or an UV irradiation unit to pre-cure the sealing material. After pre-curing the sealing material in the seal formation chamber 145 for forming a sealing material, a filler is dropped in a region surrounded by the sealing material.

The second substrate is also transferred to the attachment chamber 144 by the transport mechanism 148.

In the attachment chamber 144, after reducing pressure in the treatment chamber, the first and second substrates are attached to each other. At this moment, the first and second substrates are attached to each other by moving an upper plate or a lower plate up and down. Upon attaching the two substrates under reduced pressure, the spacing between the substrates is kept precisely due to the columnar or wall-shaped structures that have been provided on the second substrate. The columnar or wall-shaped structures also have a function of dispersing pressure applied to the substrates, which is important, to prevent breakage of the substrates.

Alternatively, the filler may be dropped in the region surrounded by the sealing material in the attachment chamber 144, instead of the seal formation chamber 145.

Instead of reducing the pressure within the entire treatment chamber, after making a space between the plates airtight by moving the upper and lower plates vertically, the airtight space therebetween may be degassed by a vacuum pump through a hole that is provided in the lower plate to reduce the pressure. In this case, since the volume to be depressurized is smaller as compared with the case of depressurizing the entire treatment chamber; thus, the pressure within the airtight space can be reduced at a short time.

Further, a transparent window may be provided in one of the upper and lower plates such that the sealing material may be cured by being irradiated with light that passes through the transparent window while maintaining the spacing between the upper and lower plates and attaching the substrates to each other.

The pair of substrates, which is temporarily attached to each other, is transferred to the curing chamber 143 by the transport mechanism 148. In the curing chamber 143, the sealing material is completely cured by light irradiation or heat treatment.

The pair of substrates is thus transferred to the unloading chamber 119 by the transport mechanism 148. The pressure within the unloading chamber 119, which has been kept under reduced pressure, is increased up to atmospheric pressure, and then the pair of attached substrates is taken out therefrom. Consequently, the sealing step for maintaining the constant gap between the substrates is completed.

This embodiment mode can be freely combined with any of Embodiment Mode 1, Embodiment Mode 2, or Embodiment Mode 3.

Embodiment Mode 5

Here, experimental results of contact resistance between a buffer layer and an anode, and measured results of light extraction efficiency will be described.

A voltage of 6V was applied to a light emitting element having a 2 mm×2 mm light emitting area, in which an anode formed with a TiN film, a buffer layer (a layer in which α-NPD and molybdenum oxide are mixed), a light emitting layer, and a cathode were provided in order. Then, a current value of 0.313 mA was obtained by measurement. Thus, the contact resistance between the TiN film and the buffer layer is good. The luminance of the element was 501 cd/m$^2$ An anode formed with a Ti film, a buffer layer (a layer in which α-NPD and molybdenum oxide are mixed), a light emitting layer, a cathode were provided in order. The current value was measured in the same manner, and a current value of 0.249 mA was obtained. Thus, the contact resistance between the Ti film and the buffer layer is also good. The luminance of the element was 577 cd/m$^2$ Further, current value of the case where an Al film (containing a minute amount of Ti) is used as an anode was measured, and the value of 0.015 mA was obtained. Thus, contact resistance of the Al film and the buffer layer is not as good as one between the buffer layer and the Ti film or the TiN film. The luminance of the element was 51 cd/m$^2$.

Further, if a translucent electrode such as a thin Ag electrode is used as a cathode, strong interference occurs; thus, the light extraction efficiency can be changed in various forms.

Figure 8:
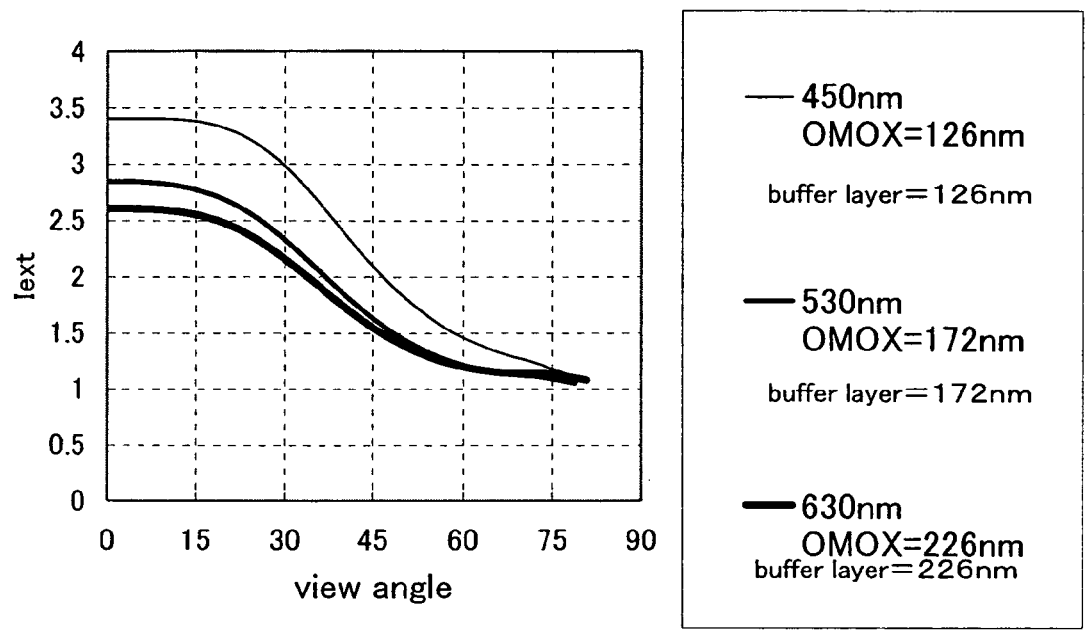
FIG. 8 shows measured results of relative luminance at a voltage of 6 V.
Figure 9:
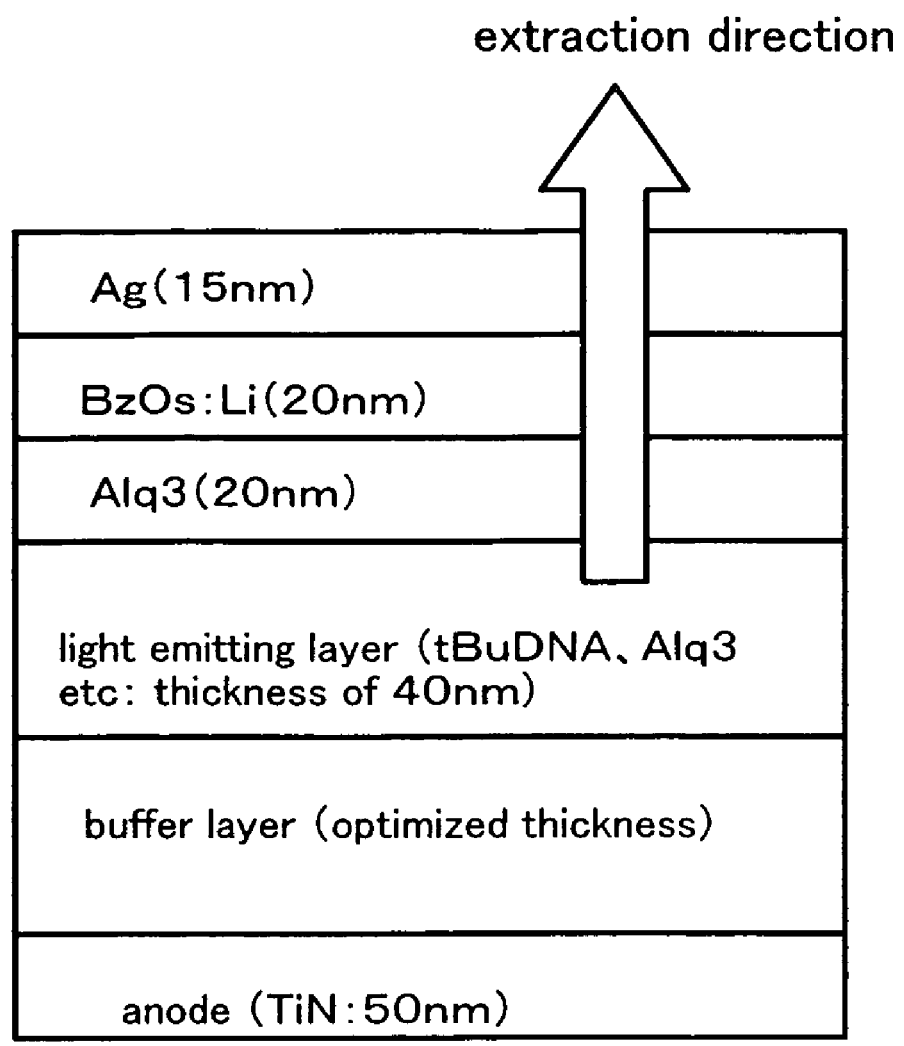
FIG. 9 shows an element structure used for the measurement.

The result of the measured result of the relative luminance of the case where 6 V is applied to an anode of TiN is shown in FIG. 8. The result shows that the same relative luminance can be obtained by optimizing the thickness of the buffer layers depending on each light emission color. Incidentally, the element structure of FIG. 9 was used for the measurement.

This embodiment mode can be freely combined with Embodiment Mode 1, Embodiment Mode 2, or Embodiment Mode 3.

Embodiment Mode 6

Semiconductor devices and electronic devices according to the present invention include cameras such as video cameras or digital cameras, goggle-type displays (head mounted displays), navigation systems, audio reproduction devices (such as car audio components or audio components), personal computers, game machines, mobile information terminals (mobile computers, cellular phones, mobile game machines, electronic books, and the like), image reproduction devices equipped with a recording medium (specifically, devices which can reproduce content of a recording medium such as Digital Versatile Disk (DVD) and have a display for displaying the image), and the like. Specific examples of the electronic devices are shown in FIGS. 10A to 10D and FIG. 11.

Figure 10A:
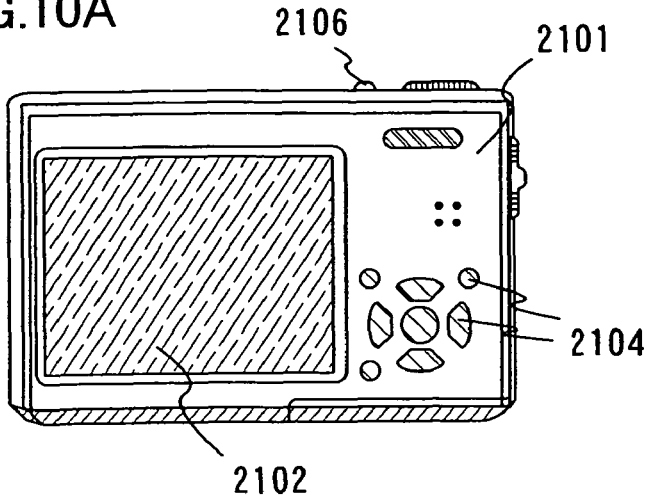
FIGS. 10A to 10D each show an example of electronic devices.

FIG. 10A shows a digital camera, which includes a main body 2102, a display area 2102, an imaging portion, operation keys 2104, a shutter 2106, and the like. FIG. 10A shows the digital camera seen from the display area 2102 side, and the imaging portion is not shown in FIG. 10A. According to the present invention, a digital camera can be manufactured through a process with reduced manufacturing cost.

Figure 10B:
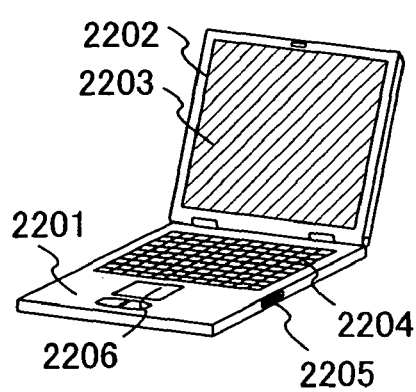

FIG. 10B shows a notebook personal computer, includes a main body 2201, a casing 2202, a display area 2203, a keyboard 2204, an external connection port 2205, a pointing mouse 2206, and the like. According to the present invention, a notebook personal computer can be manufactured through a process with reduced manufacturing cost.

Figure 10C:
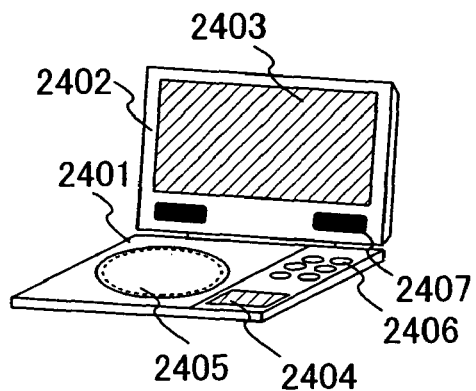

FIG. 10C shows a portable image reproducing device, which includes a recording medium (specifically, a DVD player), which includes a main body 2401, a casing 2402, a display area A 2403, a display area B 2404, a recording medium (such as a DVD) reading portion 2405, operation keys 2406, a speaker portion 2407, and the like. The display area A 2403 mainly displays image information and the display area B 2404 mainly displays text information. The category of such an image reproducing device provided with a recording medium includes an electronic game machine (typically, a home game machine), and the like. According to the present invention, an image reproducing device can be manufactured through a process with reduced manufacturing cost.

Figure 10D:
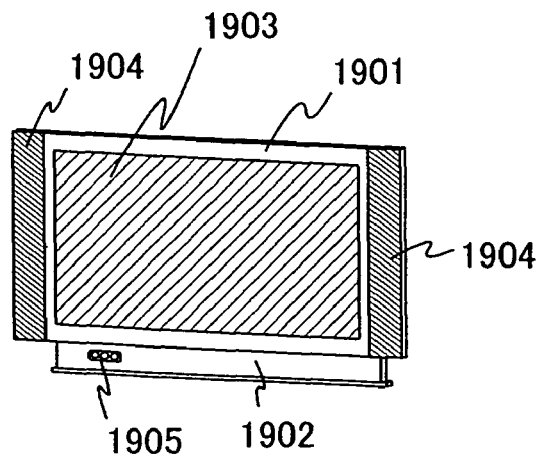

FIG. 10D shows a display device, which includes a casing 1901, a support 1902, a display area 1903, a speaker portion 1904, a video input terminal 1905, and the like. This display device is manufactured using a thin film transistor formed in accordance with a manufacturing method described in any one of the embodiment modes described above for the display area 1903 and the driver circuit. Display devices include liquid crystal display devices, light-emitting devices, and the like. Specifically, all types of display devices for displaying information, for example, display devices for computers, display devices for receiving television broadcasting, and display devices for advertisement are included. According to the present invention, a display device, in particular, a large size display device having a large screen of 22 to 50 inches can be manufactured through a process with reduced manufacturing cost.

Figure 11:
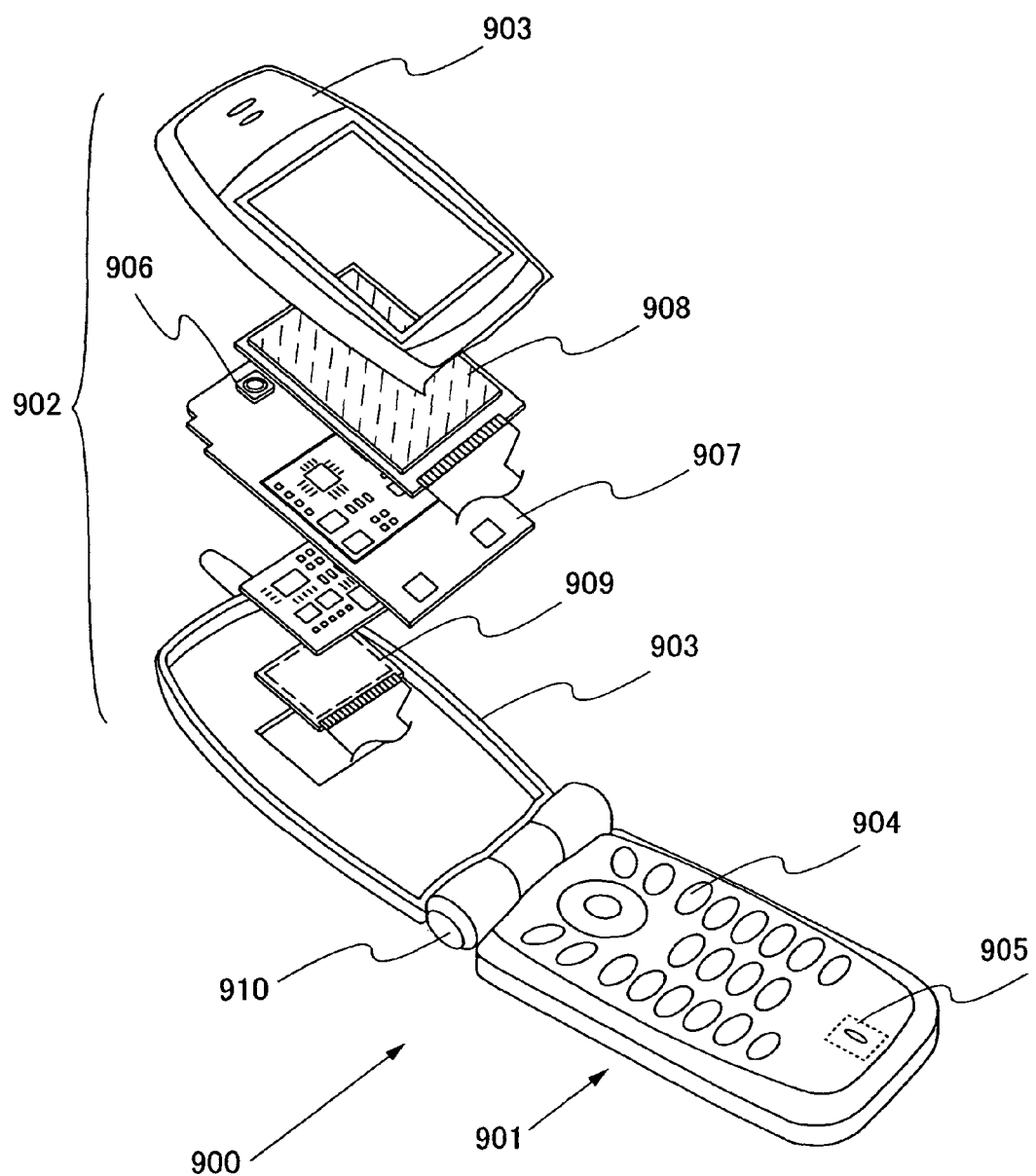
FIG. 11 shows an example of an electronic device.

In the cellular phone 900 shown in FIG. 11, a main body (A) 901 including operation switches 904, a microphone 905, and the like is connected to a main body (B) 902 including a display panel (A) 908, a display panel (B) 909, a loudspeaker 906, and the like, using a hinge 910 which makes the cellular phone foldable. The display panel (A) 908 and the display panel (B) 909 are housed in a casing 903 of the main body (B) 902 together with a circuit board 907. Pixel areas of the display panel (A) 908 and the display panel (B) 909 are disposed such that they are visible through an opening formed in the casing 903.

As to the display panel (A) 908 and the display panel (B) 909, the specification such as the number of pixels can be appropriately determined in accordance with the functions of the cellular phone 900. For example, the display panel (A) 908 and the display panel (B) 909 can be combined as a main screen and a sub-screen, respectively.

The display panel (A) 908 has a structure which can be AC operated as shown in any one of Embodiment Modes 1 to 5. According to the present invention, a mobile information terminal can be manufactured through a process with reduced manufacturing cost.

The cellular phone according to this embodiment mode can be changed in various modes depending on the functions or the use thereof. For example, a cellular phone with camera may be manufactured by implementing an imaging element in part of the hinge 910, for example. Even when the operation switches 904, the display panel (A) 908, and the display panel (B) 909 are housed in one casing, the above-described effects can be obtained. Further, similar effects can be obtained even when the structure of this embodiment mode is applied to an information display terminal provided with a plurality of display areas.

As described above, various types of electronic devices can be completed by using a manufacturing method or a structure for implementing the present invention, in other words, any one of manufacturing methods or structures in Embodiment Modes 1 to 5.

In accordance with the present invention, an active matrix light emitting device can be manufactured in a shorter time with high yield at low cost compared with conventional ones.

What is claimed is:

1. A light emitting device comprising:
a substrate having an insulating surface;
a semiconductor layer of a thin film transistor over the substrate;
a first electrode directly connected to the semiconductor layer;
an insulator covering an end portion of the first electrode;
a buffer layer over the first electrode;
a layer containing an organic compound over the buffer layer; and
a second electrode over the layer containing an organic compound,
wherein the first electrode comprises a first layer in direct contact with the semiconductor layer and with the buffer layer, and a second layer formed over of the first layer,
wherein the insulator is interposed between the second layer and the buffer layer,
wherein the first layer is continuous from the semiconductor layer to the buffer layer and is interposed between the second layer and the semiconductor layer,
wherein the first electrode has a first region and a second region having a different number of layers from the first region,
wherein a step is formed by an end part of the second layer between the first region and the second region, and
wherein the step is covered with the insulator.

2. A light emitting device according to claim 1,
wherein the buffer layer is provided in contact with the first region of the first electrode.

3. A light emitting device according to claim 1,
wherein the first electrode includes the first region having a metal film including two layers and the second region having a metal film including four layers.

4. A light emitting device according to claim 1,
wherein the first electrode includes the first region having a metal film including two layers and the second region having a metal film including three layers.

5. A light emitting device according to claim 1,
wherein the first electrode includes the first region having a single layer metal film and the second region having a metal film including two or more layers.

6. A light emitting device according to claim 1,
wherein the first electrode has a film mainly containing an element selected from the group consisting of Ti, TiN, $TiSi_xN_y$, Al, Ag, Ni, W, $WSi_x$, $WN_x$, $WSi_xN_y$, Ta, $TaN_x$, $TaSi_xN_y$, NbN, MoN, Cr, Pt, Zn, Sn, In, and Mo; or an alloy or a compound mainly containing the above element; or a stack of the films.

7. A light emitting device according to claim 1,
wherein area of a light emitting area of one light emitting element is smaller than area of the first region.

8. A light emitting device according to claim 1,
wherein the buffer layer includes a composite material of an organic compound and an inorganic compound, and
the inorganic compound is one or more selected from the group consisting of titanium oxide, zirconium oxide, hafnium oxide, vanadium oxide, niobium oxide, tantalum oxide, chromium oxide, molybdenum oxide, tungsten oxide, manganese oxide, and rhenium oxide.

9. A light emitting device according to claim 1,
wherein the buffer layer includes a composite material containing an organic compound having hole transporting characteristics and an inorganic compound.

10. A light emitting device according to claim 1,
wherein the second electrode is a light-transmitting conductive film.

11. A light emitting device according to claim 1,
wherein the light emitting device is a video camera, a digital camera, a navigation system, a personal computer, a game machine, or an information terminal.

12. A light emitting device comprising:
a substrate having an insulating surface;
a semiconductor layer of a thin film transistor over the substrate;
a first electrode electrically connected to the semiconductor layer;
an insulator covering an end portion of the first electrode;
a buffer layer over the first electrode;
a layer containing an organic compound over the buffer layer; and
a second electrode over the layer containing an organic compound,
wherein the first electrode comprises a first layer in direct contact with the semiconductor layer and with the buffer layer, and a second layer formed over of the first layer,
wherein the insulator is interposed between the second layer and the buffer layer,
wherein the first layer is continuous from the semiconductor layer to the buffer layer and is interposed between the second layer and the semiconductor layer,
wherein the first electrode has a first region and a second region having a different number of layers from the first region,
wherein a step is formed by an end part of the second layer between the first region and the second region, and
wherein the step is covered with the insulator.

13. A light emitting device according to claim 12,
wherein the light emitting device includes a pixel area provided with a plurality of light emitting elements and a driver circuit having a plurality of thin film transistors, and the driver circuit includes a wiring having a same stack as the second region.

14. A light emitting device according to claim 12,
wherein the buffer layer is provided in contact with the first region of the first electrode.

15. A light emitting device according to claim 12,
wherein the first electrode includes the first region having a metal film including two layers and the second region having a metal film including four layers.

16. A light emitting device according to claim 12,
wherein the first electrode includes the first region having a metal film including two layers and the second region having a metal film including three layers.

17. A light emitting device according to claim 12,
wherein the first electrode includes the first region having a single layer metal film and the second region having a metal film including two or more layers.

18. A light emitting device according to claim 12,
wherein the first electrode has a film mainly containing an element selected from the group consisting of Ti, TiN, $TiSi_xN_y$, Al, Ag, Ni, W, $WSi_x$, $WN_x$, $WSi_xN_y$, Ta, $TaN_x$, $TaSi_xN_y$, NbN, MoN, Cr, Pt, Zn, Sn, In, and Mo; or an alloy or a compound mainly containing the above element; or a stack of the films.

19. A light emitting device according to claim 12,
wherein area of a light emitting area of one light emitting element is smaller than area of the first region.

20. A light emitting device according to claim 12,
wherein the buffer layer includes a composite material of an organic compound and an inorganic compound, and
the inorganic compound is one or more selected from the group consisting of titanium oxide, zirconium oxide, hafnium oxide, vanadium oxide, niobium oxide, tantalum oxide, chromium oxide, molybdenum oxide, tungsten oxide, manganese oxide, and rhenium oxide.

21. A light emitting device according to claim 12,
wherein the buffer layer includes a composite material containing an organic compound having hole transporting characteristics and an inorganic compound.

22. A light emitting device according to claim 12,
wherein the second electrode is a light-transmitting conductive film.

23. A light emitting device according to claim 12,
wherein the light emitting device is a video camera, a digital camera, a navigation system, a personal computer, a game machine, or an information terminal.

24. A light emitting device comprising:
a substrate having an insulating surface;
a semiconductor layer of a thin film transistor over the substrate;
a first electrode directly connected to the semiconductor layer;
an insulator covering an end portion of the first electrode;
a buffer layer over the first electrode;
a layer containing an organic compound over the buffer layer; and
a second electrode which transmits light over the layer containing an organic compound,
wherein the first electrode comprises a first layer in direct contact with the semiconductor layer and with the buffer layer, and a second layer formed over of the first layer,
wherein the insulator is interposed between the second layer and the buffer layer,
wherein the first layer is continuous from the semiconductor layer to the buffer layer and is interposed between the second layer and the semiconductor layer,
wherein the first electrode has a first region and a second region having more layers than the first region,
wherein a step is formed by an end part of the second layer between the first region and the second region, and
wherein the step is covered with the insulator.

25. A light emitting device according to claim 24,
wherein the buffer layer is provided in contact with the first region of the first electrode.

26. A light emitting device according to claim 24,
wherein the first electrode has a film mainly containing an element selected from the group consisting of Ti, TiN, $TiSi_xN_y$, Al, Ag, Ni, W, $WSi_x$, $WN_x$, $WSi_xN_y$, Ta, $TaN_x$, $TaSi_xN_y$, NbN, MoN, Cr, Pt, Zn, Sn, In, and Mo; or an alloy or a compound mainly containing the above element; or a stack of the films.

27. A light emitting device according to claim 24,
wherein area of a light emitting area of one light emitting element is smaller than area of the first region.

28. A light emitting device according to claim 24,
wherein the buffer layer includes a composite material of an organic compound and an inorganic compound, and
the inorganic compound is one or more selected from the group consisting of titanium oxide, zirconium oxide, hafnium oxide, vanadium oxide, niobium oxide, tantalum oxide, chromium oxide, molybdenum oxide, tungsten oxide, manganese oxide, and rhenium oxide.

29. A light emitting device according to claim 24,
wherein the buffer layer includes a composite material containing an organic compound having hole transporting characteristics and an inorganic compound.

30. A light emitting device according to claim 24,
wherein the light emitting device is a video camera, a digital camera, a navigation system, a personal computer, a game machine, or an information terminal.

31. A light emitting device comprising:
a substrate having an insulating surface;
a semiconductor layer of a thin film transistor over the substrate;
a first electrode electrically connected to the semiconductor layer;
an insulator covering an end portion of the first electrode;
a buffer layer over the first electrode;
a layer containing an organic compound over the buffer layer; and
a second electrode which transmits light over the layer containing an organic compound,
wherein the first electrode comprises a first layer in direct contact with the semiconductor layer and with the buffer layer, and a second layer formed over of the first layer,
wherein the insulator is interposed between the second layer and the buffer layer,
wherein the first layer is continuous from the semiconductor layer to the buffer layer and is interposed between the second layer and the semiconductor layer,
wherein the first electrode has a first region and a second region having more layers than the first region,
wherein a step is formed by an end part of the second layer between the first region and the second region, and
wherein the step is covered with the insulator.

32. A light emitting device according to claim 31,
wherein the light emitting device includes a pixel area provided with a plurality of light emitting elements and a driver circuit having a plurality of thin film transistors, and the driver circuit includes a wiring having a same stack as the second region.

33. A light emitting device according to claim 31,
wherein the buffer layer is provided in contact with the first region of the first electrode.

34. A light emitting device according to claim 31,
wherein the first electrode has a film mainly containing an element selected from the group consisting of Ti, TiN, $TiSi_xN_y$, Al, Ag, Ni, W, $WSi_x$, $WN_x$, $WSi_xN_y$, Ta, $TaN_x$, TaSi$_X$N$_Y$, NbN, MoN, Cr, Pt, Zn, Sn, In, and Mo; or an alloy or a compound mainly containing the above element; or a stack of the films.

35. A light emitting device according to claim 31, wherein area of a light emitting area of one light emitting element is smaller than area of the first region.

36. A light emitting device according to claim 31, wherein the buffer layer includes a composite material of an organic compound and an inorganic compound, and the inorganic compound is one or more selected from the group consisting of titanium oxide, zirconium oxide, hafnium oxide, vanadium oxide, niobium oxide, tantalum oxide, chromium oxide, molybdenum oxide, tungsten oxide, manganese oxide, and rhenium oxide.

37. A light emitting device according to claim 31, wherein the buffer layer includes a composite material containing an organic compound having hole transporting characteristics and an inorganic compound.

38. A light emitting device according to claim 31, wherein the light emitting device is a video camera, a digital camera, a navigation system, a personal computer, a game machine, or an information terminal.

39. A light emitting device according to claim 1, wherein the buffer layer includes a composite material of an organic compound and an inorganic compound, and the inorganic compound shows electron accepting characteristics with respect to the organic compound.

40. A light emitting device according to claim 12, wherein the buffer layer includes a composite material of an organic compound and an inorganic compound, and the inorganic compound shows electron accepting characteristics with respect to the organic compound.

41. A light emitting device according to claim 24, wherein the buffer layer includes a composite material of an organic compound and an inorganic compound, and the inorganic compound shows electron accepting characteristics with respect to the organic compound.

42. A light emitting device according to claim 31, wherein the buffer layer includes a composite material of an organic compound and an inorganic compound, and the inorganic compound shows electron accepting characteristics with respect to the organic compound.

\* \* \* \* \*